United States Patent
Takizawa

(10) Patent No.: US 12,174,214 B2
(45) Date of Patent: Dec. 24, 2024

(54) PHYSICAL QUANTITY SENSOR, INERTIAL MEASUREMENT UNIT, AND METHOD FOR MANUFACTURING PHYSICAL QUANTITY SENSOR

(71) Applicant: SEIKO EPSON CORPORATION, Tokyo (JP)

(72) Inventor: Teruo Takizawa, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 18/316,546

(22) Filed: May 12, 2023

(65) Prior Publication Data

US 2023/0280366 A1   Sep. 7, 2023

Related U.S. Application Data

(62) Division of application No. 17/474,145, filed on Sep. 14, 2021, now Pat. No. 11,698,387.

(30) Foreign Application Priority Data

Sep. 15, 2020   (JP) .................................. 2020-154423

(51) Int. Cl.
*G01P 15/08* (2006.01)
*G01P 1/02* (2006.01)
*H01L 21/02* (2006.01)

(52) U.S. Cl.
CPC .......... *G01P 15/0802* (2013.01); *G01P 1/023* (2013.01); *H01L 21/02* (2013.01); *H01L 21/02532* (2013.01); *H01L 21/02675* (2013.01); *H01L 21/02691* (2013.01)

(58) Field of Classification Search
CPC ................. G01P 15/0802; G01P 1/023; G01P 2015/0882; H01L 21/02; H01L 21/02532; H01L 21/02675; H01L 21/02691
See application file for complete search history.

(56) References Cited

U.S. PATENT DOCUMENTS

| | | | |
|---|---|---|---|
| 2004/0253839 A1 | 12/2004 | Shimizu et al. | |
| 2007/0262358 A1* | 11/2007 | Burgmair | G01P 15/08 257/E21.409 |
| 2011/0034031 A1 | 2/2011 | Kanamori et al. | |
| 2013/0074596 A1 | 3/2013 | Takizawa | |
| 2015/0313016 A1 | 10/2015 | Naruse | |
| 2016/0033273 A1 | 2/2016 | Kamisuki | |

(Continued)

FOREIGN PATENT DOCUMENTS

| | | |
|---|---|---|
| JP | 2011-040492 A | 2/2011 |
| JP | 2013-069858 A | 4/2013 |

(Continued)

*Primary Examiner* — Julia Slutsker
(74) *Attorney, Agent, or Firm* — Harness, Dickey & Pierce, P.L.C.

(57) ABSTRACT

Provided is a physical quantity sensor including: a movable body; a base body; and a lid body, in which the movable body is accommodated in a space between the base body and the lid body, the space is sealed with a melt portion obtained by melting a through hole provided in the lid body, the lid body and the melt portion contain silicon, and the melt portion has a continuous curved surface having unevenness.

12 Claims, 23 Drawing Sheets

(56) References Cited

U.S. PATENT DOCUMENTS

| | | | |
|---|---|---|---|
| 2016/0061853 A1* | 3/2016 | Takizawa | G01D 11/245 |
| | | | 73/511 |
| 2016/0138921 A1 | 5/2016 | Takizawa et al. | |
| 2016/0368763 A1 | 12/2016 | Gonska et al. | |
| 2017/0113920 A1 | 4/2017 | Reichenbach et al. | |
| 2017/0158495 A1* | 6/2017 | Breitling | B81C 1/00277 |
| 2017/0191832 A1 | 7/2017 | Kinoshita et al. | |
| 2018/0339900 A1 | 11/2018 | Breitling et al. | |
| 2019/0071307 A1 | 3/2019 | Reinmuth et al. | |
| 2019/0098786 A1 | 3/2019 | Chida | |
| 2020/0132460 A1 | 4/2020 | Kinoshita et al. | |

FOREIGN PATENT DOCUMENTS

| | | |
|---|---|---|
| JP | 2016-018949 A | 2/2016 |
| JP | 2016-023931 A | 2/2016 |
| JP | 2016-099225 A | 5/2016 |
| JP | 2019-062111 A | 4/2019 |

* cited by examiner

PHYSICAL QUANTITY SENSOR, INERTIAL MEASUREMENT UNIT, AND METHOD FOR MANUFACTURING PHYSICAL QUANTITY SENSOR

This application is a divisional of U.S. patent application Ser. No. 17/474,145 filed Sep. 14, 2021, which claims priority from JP Application Serial Number 2020-154423, filed Sep. 15, 2020, the disclosures of which are expressly incorporated by reference herein in their entireties.

BACKGROUND

1. Technical Field

The present disclosure relates to a physical quantity sensor, an inertial measurement unit, and a method for manufacturing a physical quantity sensor.

2. Related Art

An acceleration sensor, an angular velocity sensor, and the like are realized by micro electro mechanical systems (MEMS). In the MEMS, a movable body is accommodated in a sealed space in a package. An air pressure in the sealed space is a pressure at which the movable body easily functions.

A sealing method of a package is disclosed in US Patent Application Publication NO. 2013/0074596. According to this, the package includes a cap wafer as a lid body made of silicon. A through hole is provided in the lid body. In a sealing step, the through hole is irradiated with laser light, and a periphery of the through hole is melted, and thus the through hole is closed.

However, in the sealing method of a package of US Patent Application Publication NO. 2013/0074596, there is a risk that a crack may occur in the through hole provided in a lid portion. Specifically, when the laser light is radiated, a temperature rapidly rises in the periphery of the sealing material and the through hole, and the sealing material is melted. Although the sealing material solidifies when the radiation is stopped, since thermal expansion coefficients of the sealing material and the lid portion are different from each other, thermal stress remains in the vicinity of the through hole which is close to the sealing material. Strain due to residual stress may occur, and there is risk that the crack may be induced.

SUMMARY

A physical quantity sensor includes: a movable body; a base body; and a lid body, in which the movable body is accommodated in a space between the base body and the lid body, the space is sealed with a melt portion obtained by melting a through hole provided in the lid body, the lid body and the melt portion contain silicon, and the melt portion has a continuous curved surface having unevenness.

An inertial measurement unit includes the physical quantity sensor.

A method for manufacturing a physical quantity sensor includes: forming a through hole and a recess portion in a lid body containing silicon; configuring a movable body to be accommodated in a space between the lid body and the base body; and irradiating the through hole and the recess portion with laser light to melt the through hole and the recess portion and seal the space.

DESCRIPTION OF EXEMPLARY EMBODIMENTS

First Embodiment

Figure 1:
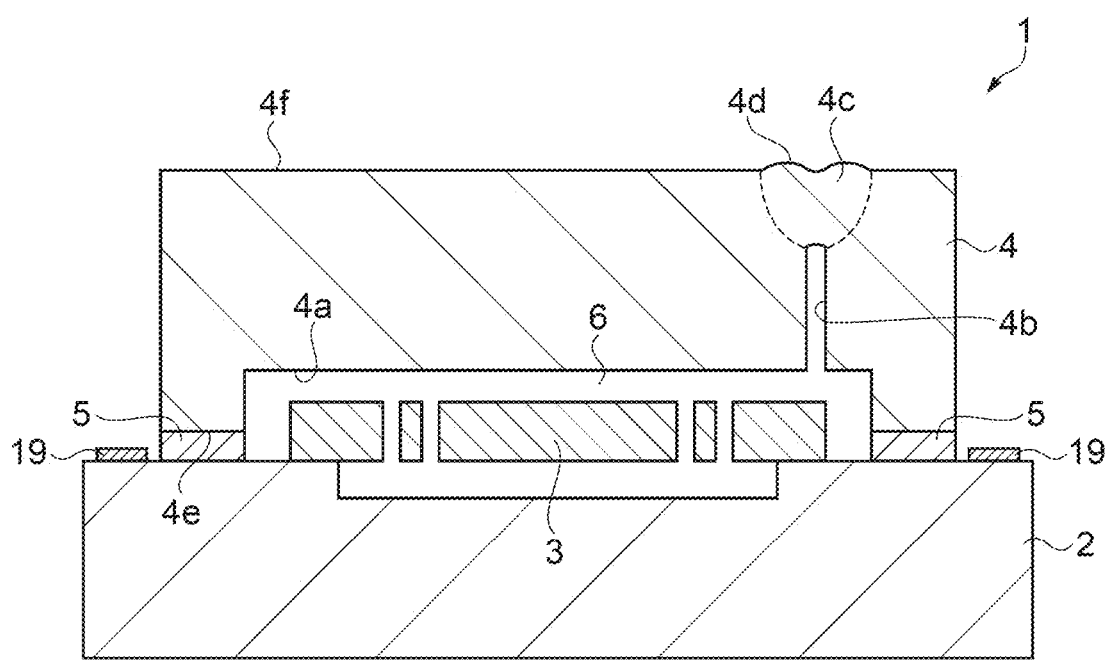
FIG. 1 is a schematic side sectional view showing a configuration of an angular velocity sensor according to a first embodiment.
Figure 1:
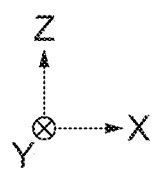

In the present embodiment, an example of a physical quantity sensor and a method for manufacturing a characteristic physical quantity sensor will be described. As shown in FIG. 1, an angular velocity sensor 1 as a physical quantity sensor includes a base body 2. The base body 2 is provided with an angular velocity detection element 3 as a movable body. A material of the base body 2 may be silicon, glass, quartz, or the like.

A lid body 4 is installed on the base body 2. A material of the lid body 4 is silicon. The lid body 4 is bonded to the base body 2 by a bonding layer 5. However, the lid body 4 may be directly bonded to the base body 2. A direction from the base body 2 toward the lid body 4 is defined as a Z direction. Planar shapes of the base body 2 and the lid body 4 are quadrangular when viewed from the Z direction. A direction in which one side of the planar shape of the base body 2 extends is defined as an X direction, and a direction orthogonal to the X direction and the Z direction is defined as a Y direction.

The lid body 4 includes a first recess portion 4a on a base body 2 side. The angular velocity detection element 3 is disposed in the first recess portion 4a. As described above, the angular velocity sensor 1 includes the lid body 4 that accommodates the angular velocity detection element 3 together with the base body 2. The angular velocity detection element 3 is accommodated in a space 6 between the base body 2 and the lid body 4. The angular velocity detection element 3 may be accommodated in the space 6, and the first recess portion 4a may not be provided on the base body 2 side of the lid body as will be described later. A through hole 4b is provided in the lid body 4. The lid body 4 includes a melt portion 4c formed by melting the through hole 4b. The melt portion 4c seals the space 6 by closing the through hole 4b. The melt portion 4c is a part of the lid body 4 and contains silicon. Electrode pads 19 electrically coupled to the angular velocity detection element 3 are disposed on the base body 2.

Although the through hole 4b penetrates during a manufacturing process of the angular velocity sensor 1, the through hole 4b is in a form of a bag hole after being closed by the melt portion 4c. A name of the through hole 4b has a meaning that the through hole 4b penetrates to the middle of manufacturing the angular velocity sensor 1.

Next, the angular velocity detection element 3 will be described.

Figure 2:
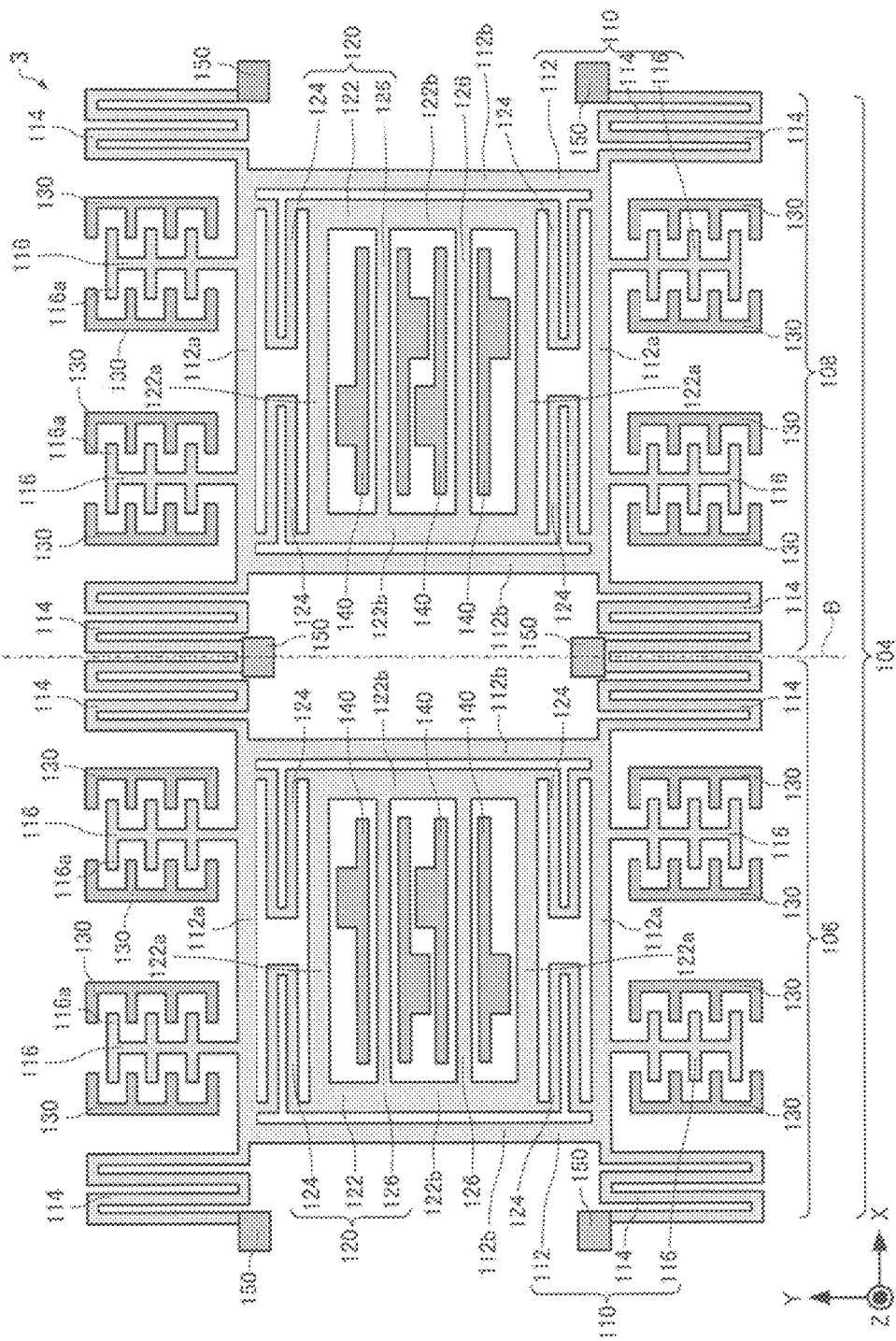
FIG. 2 is a schematic plan view showing an angular velocity detection element.

As shown in FIG. 2, the angular velocity detection element 3 includes a vibration system structure 104, drive fixed electrodes 130, detection fixed electrodes 140, and fixing portions 150.

The vibration system structure 104 is integrally formed by, for example, processing a silicon substrate bonded to the base body 2. Accordingly, a fine processing technique used for manufacturing a silicon semiconductor device can be applied, and a size of the vibration system structure 104 can be reduced.

The vibration system structure 104 is supported by the fixing portions 150 fixed to the base body 2, and is disposed in a manner of being separated from the base body 2. The vibration system structure 104 includes a first vibrating body 106 and a second vibrating body 108. The first vibrating body 106 and the second vibrating body 108 are coupled to each other along an X axis.

The first vibrating body 106 and the second vibrating body 108 have shapes that are symmetrical with respect to a boundary line B between the first vibrating body 106 and the second vibrating body 108. The boundary line B is a straight line along a Y axis. A configuration of the first vibrating body 106 will be described, and a description of the configuration of the second vibrating body 108 will be omitted.

The first vibrating body 106 includes a drive unit 110 and a detection unit 120. The drive unit 110 includes a drive support portion 112, drive spring portions 114, and drive movable electrodes 116.

The drive support portion 112 has, for example, a frame shape, and the detection unit 120 is disposed inside the drive support portion 112. The drive support portion 112 includes a first extending portion 112a extending along the X axis and a second extending portion 112b extending along the Y axis.

The drive spring portion 114 is disposed outside the drive support portion 112. One end of the drive spring portion 114 is coupled to the vicinity of a corner portion of the drive support portion 112. The corner portion of the drive support portion 112 is a coupling portion between the first extending portion 112a and the second extending portion 112b. Another end of the drive spring portion 114 is coupled to the fixing portion 150.

In the first vibrating body 106, four drive spring portions 114 are provided. The first vibrating body 106 is supported by four fixing portions 150. The fixing portions 150 on the boundary line B between the first vibrating body 106 and the second vibrating body 108 may not be provided. The first vibrating body 106 and the second vibrating body 108 may be directly coupled using an elastically deformable coupling portion.

The drive spring portion 114 has a shape extending along the X axis while reciprocating along the Y axis. The plurality of drive spring portions 114 are symmetrically provided with respect to a virtual line (not shown) along the X axis passing through a center of the drive support portion 112 and a virtual line (not shown) along the Y axis passing through the center of the drive support portion 112. By forming the drive spring portion 114 into the above-described shape, the drive spring portion 114 can be inhibited from being deformed in a Y-axis direction and a Z-axis direction, and the drive spring portion 114 can be smoothly extended and contracted in an X-axis direction, which is a vibration direction of the drive unit 110. With the expansion and contraction of the drive spring portion 114, the drive support portion 112 can be vibrated along the X axis.

Outside the drive support portion 112, the drive movable electrodes 116 are coupled to the drive support portion 112. The drive movable electrode 116 is coupled to the first extending portion 112a of the drive support portion 112.

The drive fixed electrode 130 is disposed on an outer side of the drive support portion 112. The drive fixed electrode 130 is fixed on the base body 2. A plurality of drive fixed electrodes 130 are provided and arranged in a manner of facing the drive movable electrode 116. The drive fixed electrode 130 has a comb shape. The drive movable electrode 116 has protruding portions 116a that can be inserted between comb teeth of the drive fixed electrode 130. By reducing a distance between the drive fixed electrode 130 and the protruding portion 116a, an electrostatic force acting between the drive fixed electrode 130 and the drive movable electrode 116 can be increased.

When a voltage is applied to the drive fixed electrode 130 and the drive movable electrode 116, an electrostatic force can be generated between the drive fixed electrode 130 and the drive movable electrode 116. Accordingly, the drive spring portion 114 expands and contracts along the X axis, and the drive support portion 112 of the drive unit 110 can be vibrated along the X axis.

The detection unit 120 is coupled to the drive unit 110. In the shown example, the detection unit 120 is disposed inside the drive support portion 112. The detection unit 120 may include a detection support portion 122, detection spring portions 124, and detection movable electrodes 126. Although not shown, if the detection unit 120 is coupled to the drive unit 110, the detection unit 120 may be disposed on an outer side of the drive support portion 112.

The detection support portion 122 has, for example, a frame shape. In the shown example, the detection support portion 122 includes third extending portions 122a extending along the X axis and fourth extending portions 122b extending along the Y axis.

The detection spring portion 124 is disposed on an outer side of the detection support portion 122. The detection spring portion 124 couples the detection support portion 122 and the drive support portion 112. More specifically, one end of the detection spring portion 124 is coupled to the vicinity of a corner portion of the detection support portion 122. The corner portion of the detection support portion 122 is a coupling portion between the third extending portion 122a and the fourth extending portion 122b. Another end of the detection spring portion 124 is coupled to the first extending portion 112a of the drive support portion 112.

The detection spring portion 124 has a shape extending along the Y axis while reciprocating along the X axis. In the shown example, four detection spring portions 124 are provided in the first vibrating body 106. The plurality of detection spring portions 124 are symmetrically provided with respect to a virtual line (not shown) along the X axis passing through a center of the detection support portion 122 and a virtual line (not shown) along the Y axis passing through the center of the detection support portion 122. By forming the detection spring portion 124 into a shape as described above, deformation of the detection spring portion 124 in the X-axis direction and the Z-axis direction can be inhibited, and the detection spring portion 124 can be smoothly expanded and contracted in the Y-axis direction which is the vibration direction of the detection unit 120. With the expansion and contraction of the detection spring portion 124, the detection support portion 122 of the detection unit 120 can be vibrated along the Y axis. The number of the detection spring portions 124 is not particularly limited as long as the detection spring portions 124 can vibrate the detection support portion 122 along the Y axis.

The detection movable electrode 126 is disposed inside the detection support portion 122 in a manner of being coupled to the detection support portion 122. In the shown example, the detection movable electrode 126 extends along the X-axis, and is coupled to the two fourth extending portions 122b of the detection support portion 122.

The detection fixed electrode 140 is disposed on the inner side of the detection support portion 122. The detection fixed electrode 140 is fixed on the base body 2. In the shown example, the plurality of detection fixed electrodes 140 are provided, and are arranged in a manner of facing each other with the detection movable electrode 126 interposed therebetween.

The numbers and shapes of the detection movable electrodes 126 and the detection fixed electrodes 140 are not particularly limited as long as a change in capacitance between the detection movable electrode 126 and the detection fixed electrode 140 can be detected.

Next, an operation of the angular velocity detection element 3 will be described. FIGS. 3 to 6 are schematic views for describing the operation of the angular velocity detection element 3 of the angular velocity sensor 1 according to the present embodiment. For convenience, in FIGS. 3 to 6, parts of the angular velocity detection element 3 are shown in a simplified manner.

Figure 3:
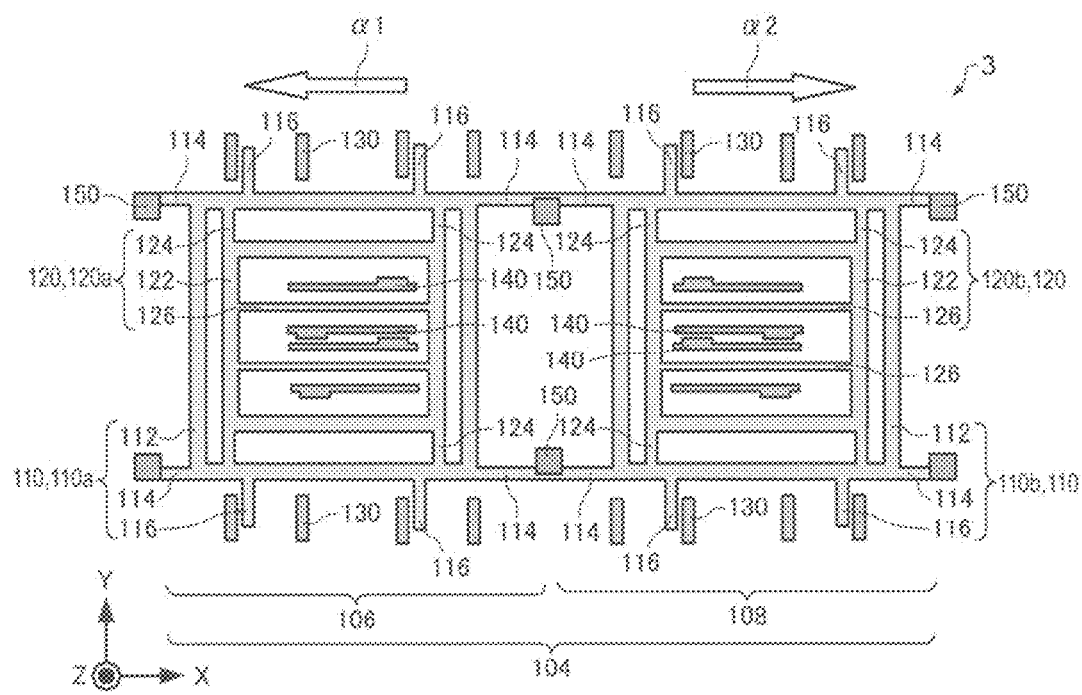
FIG. 3 is a schematic diagram for describing an operation of the angular velocity detection element.
Figure 4:
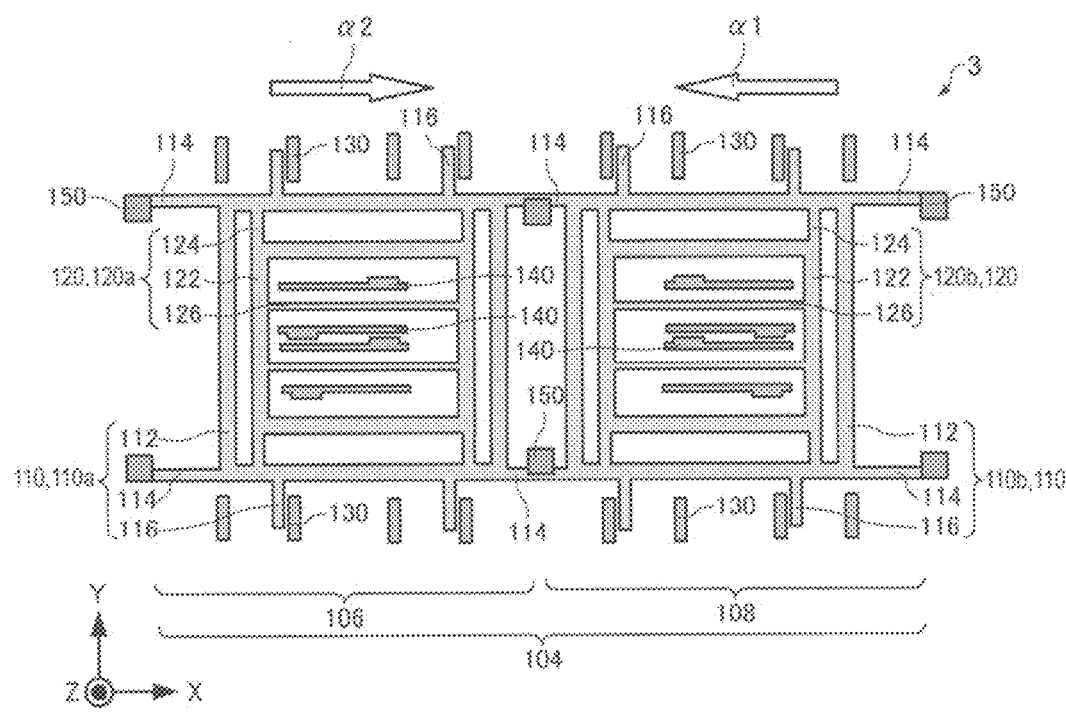
FIG. 4 is a schematic diagram for describing the operation of the angular velocity detection element.

When a voltage is applied to the drive fixed electrode 130 and the drive movable electrode 116, an electrostatic force can be generated between the drive fixed electrode 130 and the drive movable electrode 116. Accordingly, as shown in FIGS. 3 and 4, the drive spring portion 114 can be expanded and contracted along the X axis, and the drive unit 110 can be vibrated along the X axis.

More specifically, a first alternating voltage is applied between the drive movable electrode 116 and the driving fixed electrode 130 of the first vibrating body 106, and a second alternating voltage whose phase deviated by 180 degrees from that of the first alternating voltage is applied between the drive movable electrode 116 and the driving fixed electrode 130 of the second vibrating body 108. Accordingly, a first driving unit 110a of the first vibrating body 106 and a second driving unit 110b of the second vibrating body 108 can be vibrated along the X axis in opposite phases and at a predetermined frequency. That is, the first driving unit 110a and the second driving unit 110b coupled to each other along the X axis vibrate in opposite phases to each other along the X axis. The vibration is referred to as a first vibration. For example, first, as shown in FIG. 3, the first driving unit 110a is displaced in an α1 direction, and the second driving unit 110b is displaced in an α2 direction opposite to the α1 direction. Next, as shown in FIG. 4, the first driving unit 110a is displaced in the α2 direction, and the second driving unit 110b is displaced in the α1 direction. The first driving unit 110a and the second driving unit 110b repeat the operation. In this way, the first driving unit 110a and the second driving unit 110b vibrate in mutually opposite phases.

Since the detection unit 120 is coupled to the drive unit 110, the detection unit 120 also vibrates along the X axis in accordance with the vibration of the drive unit 110. That is, the first vibrating body 106 and the second vibrating body 108 vibrate in mutually opposite phases along the X axis. The vibration is referred to as a first vibration.

Figure 5:
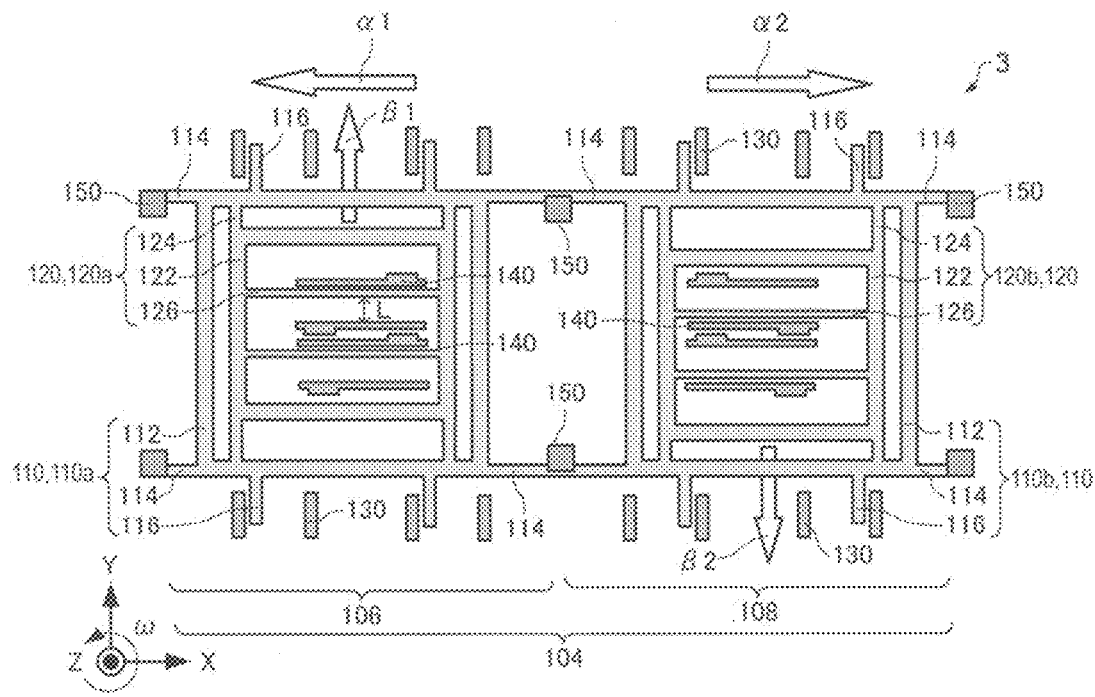
FIG. 5 is a schematic diagram for describing the operation of the angular velocity detection element.
Figure 6:
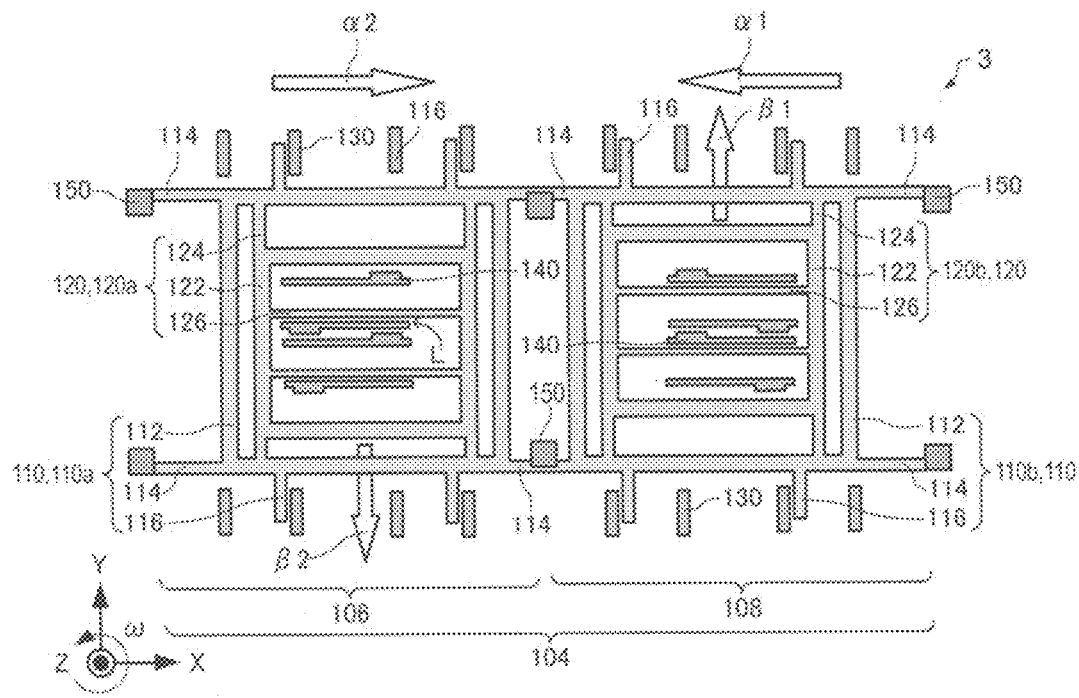
FIG. 6 is a schematic diagram for describing the operation of the angular velocity detection element.

As shown in FIGS. 5 and 6, when an angular velocity ω around a Z axis is applied to the angular velocity detection element 3 in a state where the first driving unit 110a and the second driving unit 110b perform the first vibration, the Coriolis force acts, and the detection unit 120 is displaced along the Y axis. That is, a first detection unit 120a coupled to the first driving unit 110a and a second detection unit 120b coupled to the second driving unit 110b are displaced in mutually opposite directions along the Y axis by the first vibration and the Coriolis force. For example, first, as shown in FIG. 5, the first detection unit 120a is displaced in a β1 direction, and the second detection unit 120b is displaced in a β2 direction opposite to the β1 direction. Next, as shown in FIG. 6, the first detection unit 120a is displaced in the β2 direction, and the second detection unit 120b is displaced in the β1 direction. The first detection unit 120a and the second detection unit 120b repeat the operation while receiving the Coriolis force.

By displacing the first detection unit 120a and the second detection unit 120b along the Y axis, a distance L between the detection movable electrode 126 and the detection fixed electrode 140 changes. Therefore, capacitance between the detection movable electrode 126 and the detection fixed electrode 140 changes. In the angular velocity detection element 3, by applying a voltage to the detection movable electrode 126 and the detection fixed electrode 140, a change amount in capacitance between the detection movable electrode 126 and the detection fixed electrode 140 can be detected, and the angular velocity ω around the Z axis can be obtained.

Figure 7:
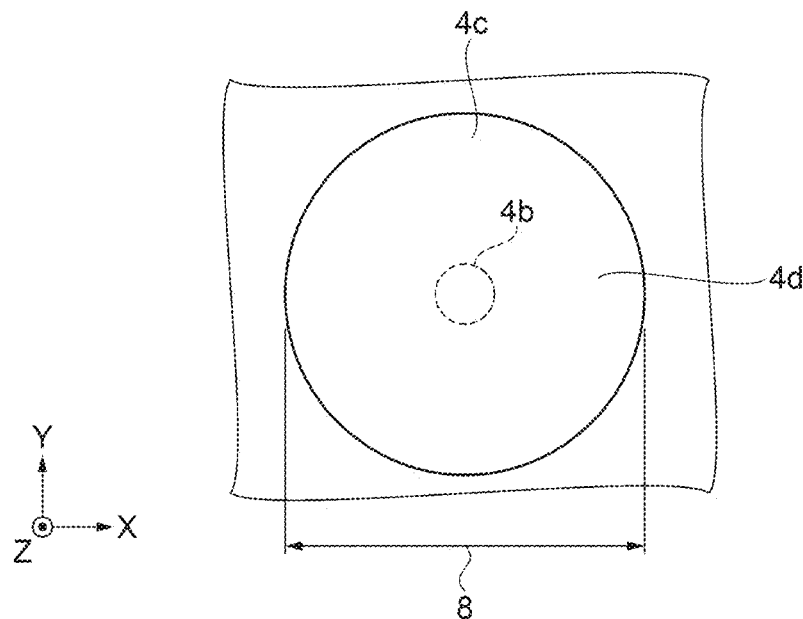
FIG. 7 is a schematic plan view of a main portion of a melt portion.
Figure 8:
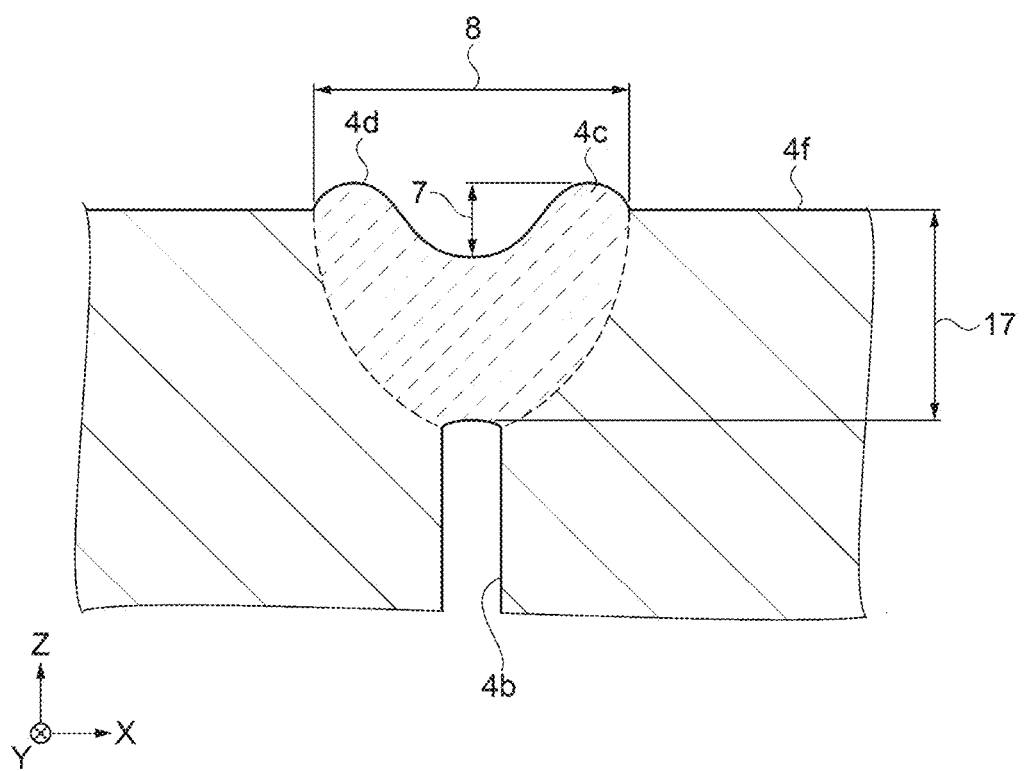
FIG. 8 is a schematic side sectional view of the main portion of the melt portion.

Next, the melt portion 4c of the lid body 4 will be described. As shown in FIGS. 7 and 8, when viewed from the Z direction, the melt portion 4c has a substantially circular shape and overlaps with the through hole 4b. The melt portion 4c has a continuous curved surface 4d having unevenness.

According to the configuration, since the through hole 4b is sealed, the space 6 is sealed by the lid body 4. Laser light is radiated, and the melt portion 4c is formed. The melt portion 4c is a polycrystal, and the periphery of the melt portion 4c is a single crystal. The melt portion 4c and the periphery of the melt portion 4c have different crystal structures. In a place where the crystal structure rapidly changes, a change in residual stress is large, and a crack is likely to occur. When the melt portion 4c is provided with a continuous curved surface 4d having unevenness, the crystal structure is gently changed. Therefore, since the change in residual stress is gentle, an occurrence of cracks can be inhibited.

The lid body 4 is a single crystal, and the melt portion 4c is polycrystalline. Specifically, the lid body 4 other than the melt portion 4c is a single crystal. According to the configuration, the polycrystalline melt portion 4c can be easily formed by irradiating the lid body 4, which is a single crystal, with laser light and heating the lid body 4.

Although a dimension of the lid body 4 is not particularly limited, in the present embodiment, for example, the thickness of the lid body 4 is 180 μm. A depth of the first recess portion 4a is 50 μm. Therefore, a thickness of the lid body 4 in the first recess portion 4a is 130 μm.

A diameter of the through hole 4b is 10 μm to 30 μm. A melt portion uneven depth 7, which is the depth of the melt portion 4c, is preferably 10 μm or more and 50 μm or less. The melt portion unevenness depth 7 indicates a length from a bottom of a recessed portion of the melt portion 4c to a protruding portion. When a beam condensing diameter of a laser light is 200 μm, a melt portion diameter 8 of the melt portion 4c is 140 μm to 220 μm. That is, a size is 70 to 110% of the beam condensing diameter. A length from a second surface 4f to an end surface of the through hole 4b is set as a melt portion depth 17. The melt portion depth 17 is set to D, and the melt portion diameter 8 is denoted by L. A D/L ratio, which is a depth diameter ratio obtained by dividing the melt portion depth 17 by the melt portion diameter 8, is preferably 0.5 or more and 3.0 or less.

The angular velocity detection element 3 always vibrates at a constant frequency, and the air pressure of the space 6 is reduced in order to reduce a resistance at the time of vibration. In order to stably vibrate the angular velocity detection element 3 in a state where a Q value of the vibration is high, the air pressure of the space 6 is 0.1 Pa to 10 Pa.

When a crack is formed in the lid body 4, a leak path is formed between the space 6 and an outside air. The air pressure in the space 6 is the atmospheric pressure. At the time, a vibration of the angular velocity detection element 3 is attenuated, and a detection sensitivity of the angular velocity detection element 3 decreases.

Figure 9:
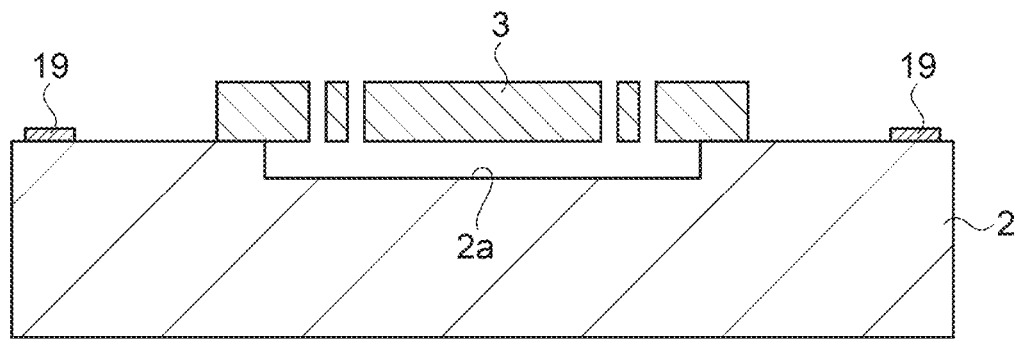
FIG. 9 is a schematic view for describing a method for manufacturing the angular velocity sensor.
Figure 9:
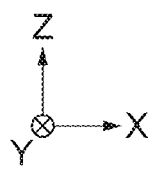

Next, a method for manufacturing the angular velocity sensor 1 will be described. In FIG. 9, a recess portion 2a is formed in a base body 2 which is an insulating base body, and a metal wiring (not shown) is formed. The base body 2 may be made of glass, quartz, or the like. In the present embodiment, for example, Tempax (registered trademark) glass is used. When glass is used for the base body 2, the recess portion 2a is formed by wet etching with HF. HF represents hydrogen fluoride. The angular velocity detection element 3 is formed by anodic bonding the silicon substrate, and then performing vertical processing by a Bosch process. By alloying a bump and silicon on a metal wiring (not shown) by heat treatment, a good electrical coupling can be obtained. If platinum is used as an outermost surface of the metal wiring, a good silicide alloy may be formed. A method of forming the angular velocity detection element 3 is known, and a detailed description thereof will be omitted.

Figure 10:
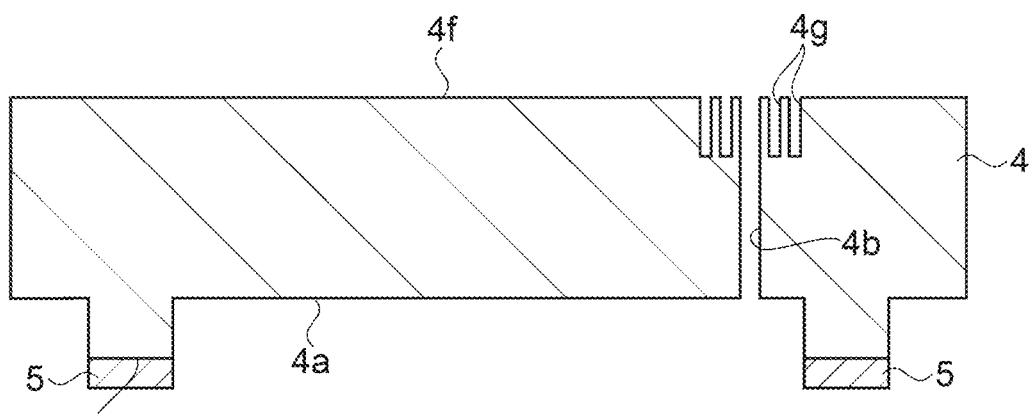
FIG. 10 is a schematic view for describing the method for manufacturing the angular velocity sensor.
Figure 10:
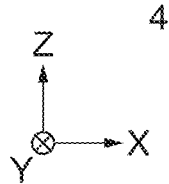

As shown in FIG. 10, a substrate which is a material of the lid body 4 is prepared. The substrate of the lid body 4 has a (100) plane made of silicon. The first recess portion 4a having a depth of about 30 μm to 50 μm is formed in a first surface 4e by the Bosch process. In the lid body 4, a surface on a side opposite to the first surface 4e is referred to as a second surface 4f. The through hole 4b and second recess portions 4g as recesses are further formed on the second surface 4f of the lid body 4 by the Bosch process. The second recess portion 4g is also referred to as a dummy pattern. An etching depth of the through hole 4b and the second recess portion 4g may be controlled by using a micro loading effect or by adjusting a thickness of a mask. Next, the bonding layer 5 is formed on the lid body 4. The bonding layer 5 is printed on an entire wafer on a lid body 4 side using a screen printing technique. The bonding layer 5 may be disposed on the base body 2. In this way, the through hole 4b and the second recess portion 4g are formed from the second surface 4f in the lid body 4 containing silicon.

Figure 11:
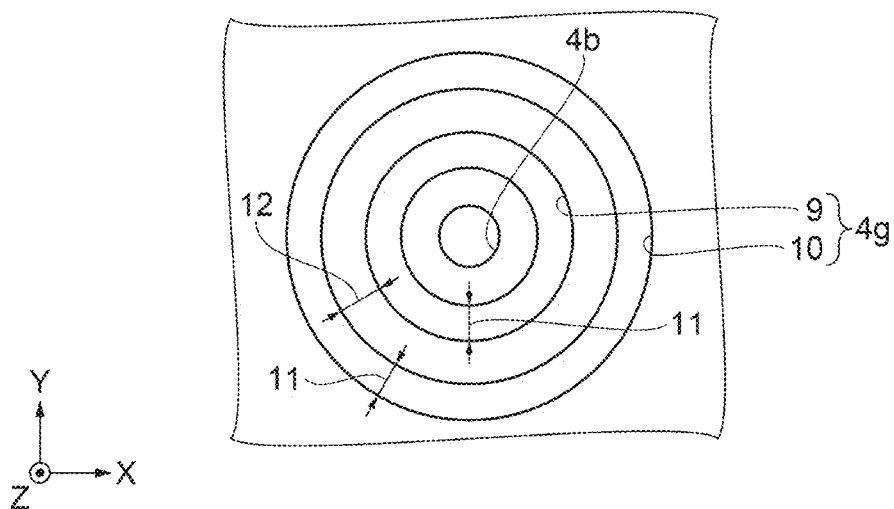
FIG. 11 is a schematic plan view showing a shape of a second recess portion.

As shown in FIG. 11, the second recess portion 4g is constituted by a first groove 9 and a second groove 10 which are concentric with the through hole 4b in a plan view seen from the Z direction. A groove width 11 of the first groove 9 and the second groove 10 is preferably 10 μm or more and 20 μm or less. An inter-groove distance 12 of the first groove 9 and the second groove 10 is preferably 10 μm or more and 20 μm or less.

Figure 12:
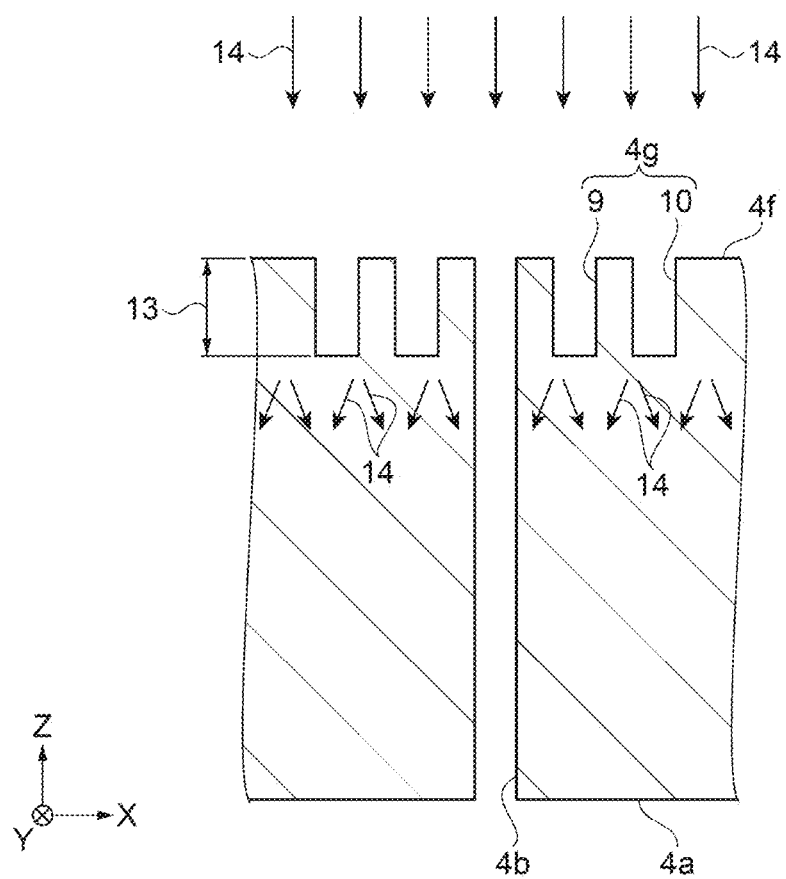
FIG. 12 is a schematic side sectional view showing the shape of the second recess portion.

As shown in FIG. 12, a groove depth 13 of the first groove 9 and the second groove 10 is 20 μm or more and 40 μm or less. The through hole 4b and the second recess portion 4g are formed by using a known Bosch process method. The Bosch process method enables etching with a high aspect ratio.

The groove depth 13 may be controlled by changing the number of times of etching of the through hole 4b and the second recess portion 4g. For example, a length of the through hole 4b is 130 μm, and the groove depth 13 is 30 μm. The digging depth in one etching cycle is assumed to be 1 μm. By performing 100 cycles of etching, the through hole 4b is dug by 100 μm. Next, 30 cycles of etching are added to dig the through hole 4b and the second recess portion 4g in parallel by 30 µm. By the above method, the through hole 4b penetrates, and the groove depth 13 is 30 µm.

Figure 13:
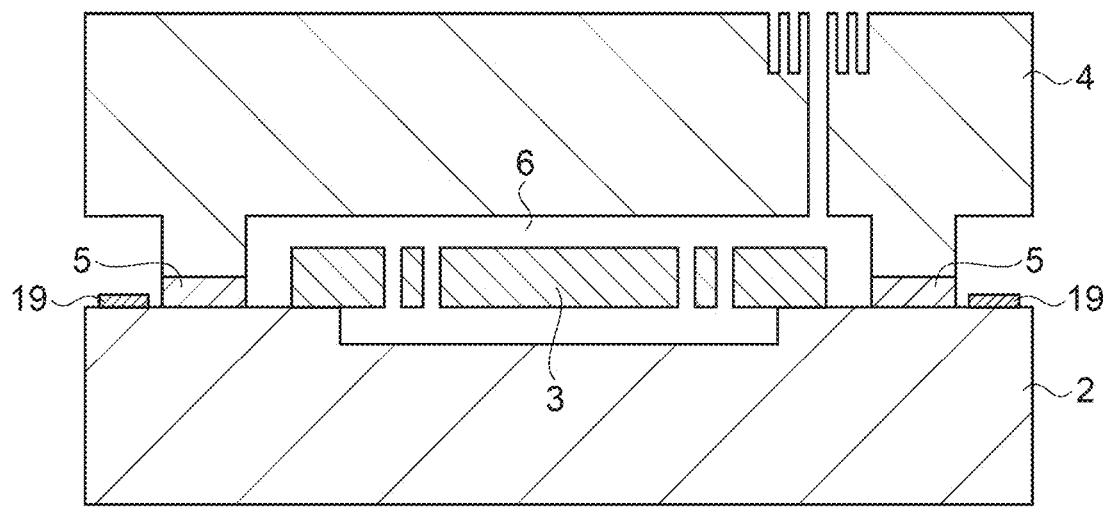
FIG. 13 is a schematic view for describing the method for manufacturing the angular velocity sensor.
Figure 13:
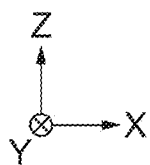

As shown in FIG. 13, the lid body 4 and the base body 2 are bonded to each other. The bonding is performed by applying pressure and heating. The pressurization is performed in a range of 10 to 1000 kPa, and the heating is performed in a range of 250 to 500° C. The atmosphere may be an inert gas such as nitrogen or argon, and the air pressure may be vacuum, an atmospheric pressure, or a positive pressure. The lid body 4 is bonded to the base body 2 by using a glass frit material serving as the bonding layer 5. Although in the present embodiment, frit bonding using glass frit is used, anodic bonding, direct bonding, metal eutectic bonding, or plasma activation bonding may be used. The through hole 4b and the second recess portion 4g may be formed after the bonding layer 5 is bonded. The angular velocity detection element 3 is accommodated in the space 6 between the provided base body 2 and the lid body 4.

Figure 14:
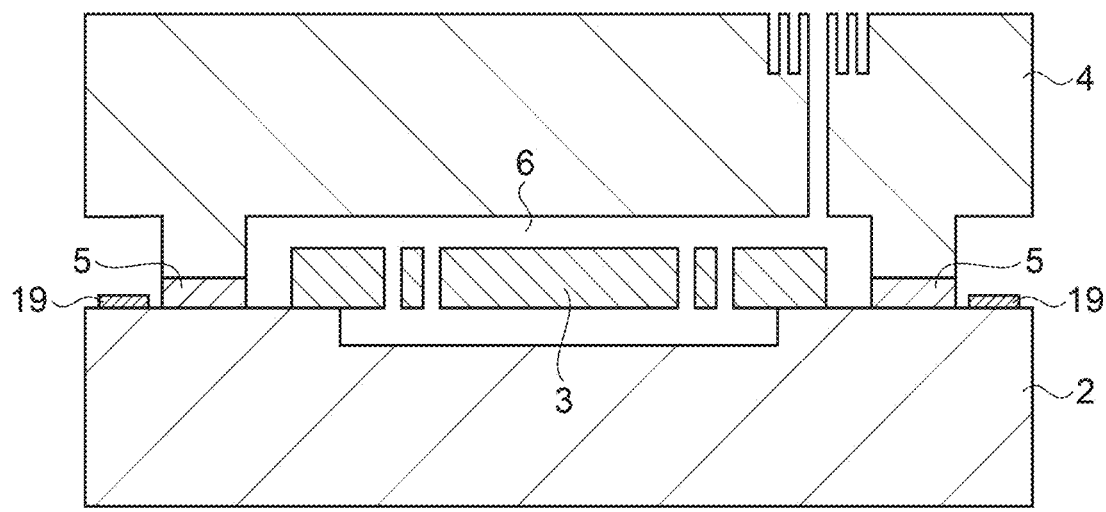
FIG. 14 is a schematic view for describing the method for manufacturing the angular velocity sensor.
Figure 14:
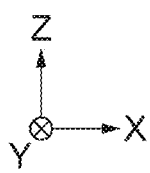

As shown in FIG. 14, degassing processing is performed by vacuum heating processing. Specifically, heating is performed at 300° C. or higher and 100 Pa or lower for several hours. The gas in the space 6 is taken out from the through hole 4b to an outside. In the present embodiment, for example, a pressure inside a decompression chamber is reduced to 1 Pa. An inside of the chamber has a reduced-pressure atmosphere. Next, hydrophobic treatment is performed such that moisture does not adhere to the space 6. In the hydrophobic treatment, HMDS, which is a silane coupling agent, was used. HMDS represents hexamethyldisilazane. By such a hydrophobic treatment, a moisture content of the space 6 can be reduced to 100 ppm or less. By preventing an entry of moisture, the space 6 can be maintained in a high vacuum state. Therefore, the angular velocity detection element 3 can be stably vibrated in a state where the Q value of the vibration is high.

Figure 15:
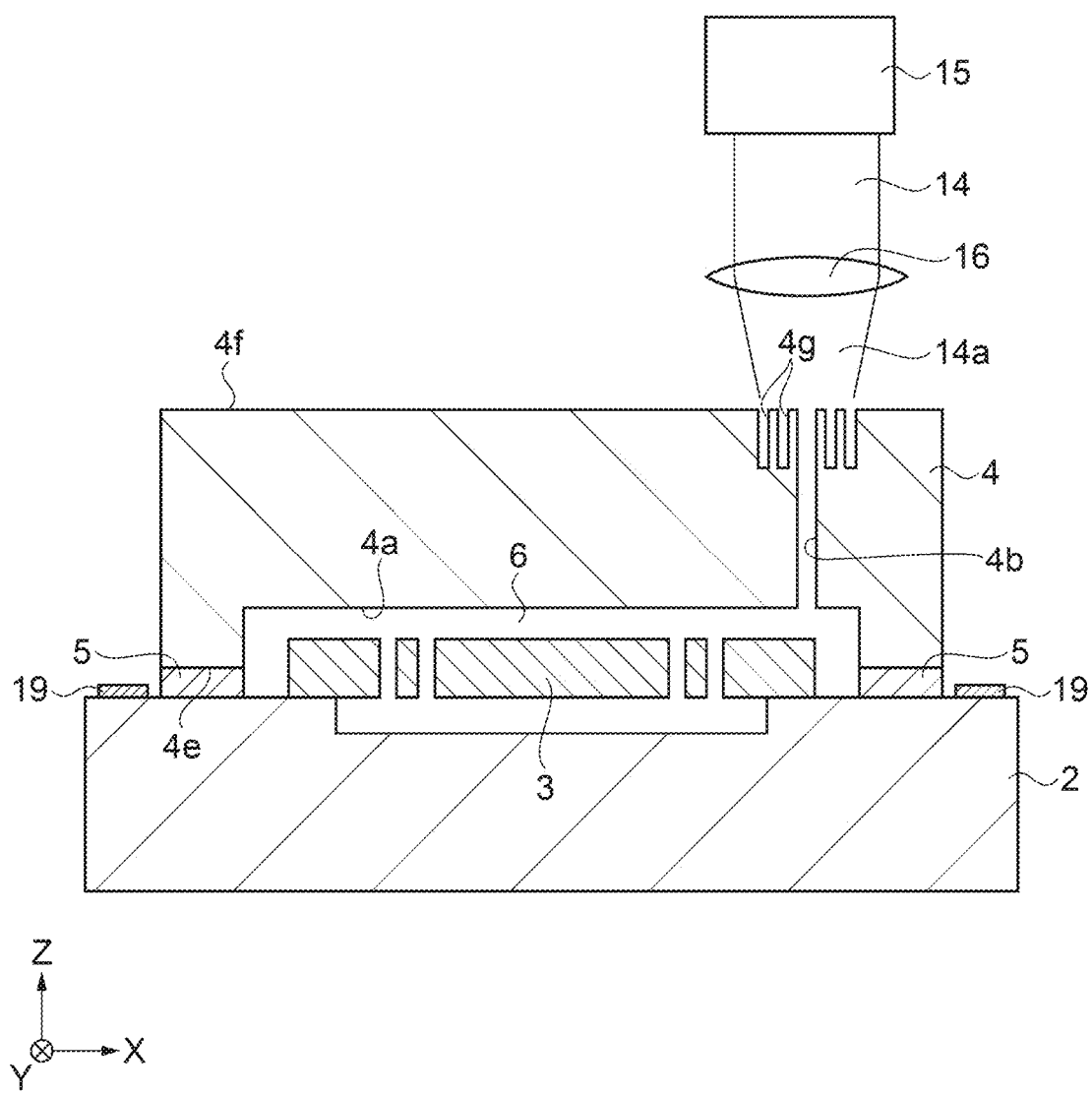
FIG. 15 is a schematic view for describing the method for manufacturing the angular velocity sensor.

Next, as shown in FIG. 15, the second recess portions 4g and the through hole 4b are irradiated with the laser light 14. In a state in which the base body 2 and the lid body 4 are heated and the temperature of the lid body 4 is increased, the through hole 4b and the second recess portion 4g are simultaneously irradiated with the laser light 14. The laser light 14 is emitted from a laser light source 15 and condensed by a condensing optical system 16. A diameter of a condensing portion 14a on which the laser light 14 is condensed is 100 µm to 200 µm. In the second recess portion 4g, a diffraction of the laser light 14 can be promoted, and the second recess portion 4g can be melted by lower energy. Therefore, an amount of dross, debris, and the like is small, and cracks are unlikely to occur. Since a temperature of the lid body 4 is increased, the second recess portion 4g can be melted by lower energy. A power of the laser light 14 may be 0.5 to 1.0 times the power at which the flat second surface 4f is melted. The second recess portion 4g and the through hole 4b are irradiated with the laser light 14, the second recess portion 4g and the through hole 4b are melted, and the space 6 is sealed. The radiation of the laser light 14 is performed under a reduced-pressure atmosphere in a chamber including a window portion transparent to the laser light 14. When the laser light 14 is radiated, the lid body 4 is heated via the base body 2.

A wavelength of the laser light 14 is 1070 nm to 1100 nm, which is close to a silicon band gap. Since the material of the lid body 4 is silicon, a laser having a wavelength with a small light absorption coefficient was selected such that an ablation phenomenon did not occur in a laser irradiation process. A wavelength having a small light absorption coefficient is a laser having a wavelength in the vicinity of the band gap wavelength of silicon or a wavelength longer than the band gap wavelength. When the wavelength is 800 nm or more, the light absorption coefficient can be set to 300 cm$^{-1}$ or less. When a laser having such a wavelength is selected, silicon can be melted by thermal processing. In the present embodiment, for example, an yttrium aluminum garnet (YAG) laser is used, and the wavelength of the laser light 14 is set to about 1064 nm.

As shown in FIG. 12, the laser light 14 is diffracted by the second recess portion 4g, and laser melting can be performed more efficiently. For example, when a laser irradiation energy capable of melting a flat surface is set to E0, good melting can be performed by an energy amount of 0.1 to 0.5×E0. Therefore, hole sealing by which debris and dross are inhibited can be performed.

According to the method, the through hole 4b and the second recess portion 4g are formed in the lid body 4. The through hole 4b is irradiated with the laser light 14. The lid body 4 is melted to close the through hole 4b. Since a part of the laser light 14 is diffracted in the second recess portion 4g, the laser light 14 travels in multiple directions in the periphery of the through hole 4b. The laser light 14 is absorbed by silicon at a shallow location close to a surface of the lid body 4. In the through hole 4b, a temperature near the surface of the lid body 4 is high, and the temperature gradually decreases as a distance from the surface increases. As a distance from the through hole 4b increases, the temperature gradually decreases.

The melt portion 4c is a polycrystal, and the periphery of the melt portion 4c is a single crystal. Although the melt portion 4c and the periphery of the melt portion 4c have different crystal structures, thermal expansion coefficients thereof are substantially the same. In the through hole 4b, a crystal structure gradually changes as the distance from the surface of the lid body 4 increases. As the distance from the through hole 4b increases, the crystal structure gradually changes. Therefore, since the change in residual stress is gentle, the occurrence of cracks can be inhibited.

When the laser light 14 is radiated, the angular velocity sensor 1 is in a reduced-pressure atmosphere inside the chamber including a window portion transparent with respect to the laser light 14, and the lid body 4 is heated via the base body 2. According to the above method, since the through hole 4b is sealed in a reduced-pressure atmosphere, the space 6 for accommodating the angular velocity detection element 3 is sealed in a reduced-pressure state. Since a thermal conductivity of an atmosphere gas is low in the reduced-pressure atmosphere, the temperature of the lid body 4 decreases. In general, a thermal conductivity of gas greatly changes at 100 to 1,000 Pa. Therefore, since a pressure in the space 6, at which the angular velocity detection element 3 is easy to operate, is 0.1 to 10 Pa, if the lid body 4 is heated via the base body 2, an efficiency is significantly reduced. When the temperature of the lid body 4 decreases, the lid body 4 is difficult to melt, and stronger laser radiation energy is required. This causes debris and dross. In this method, since the lid body 4 is sufficiently heated to 300° C. or higher, the lid body 4 can be reliably melted to seal the through hole 4b.

Figure 16:
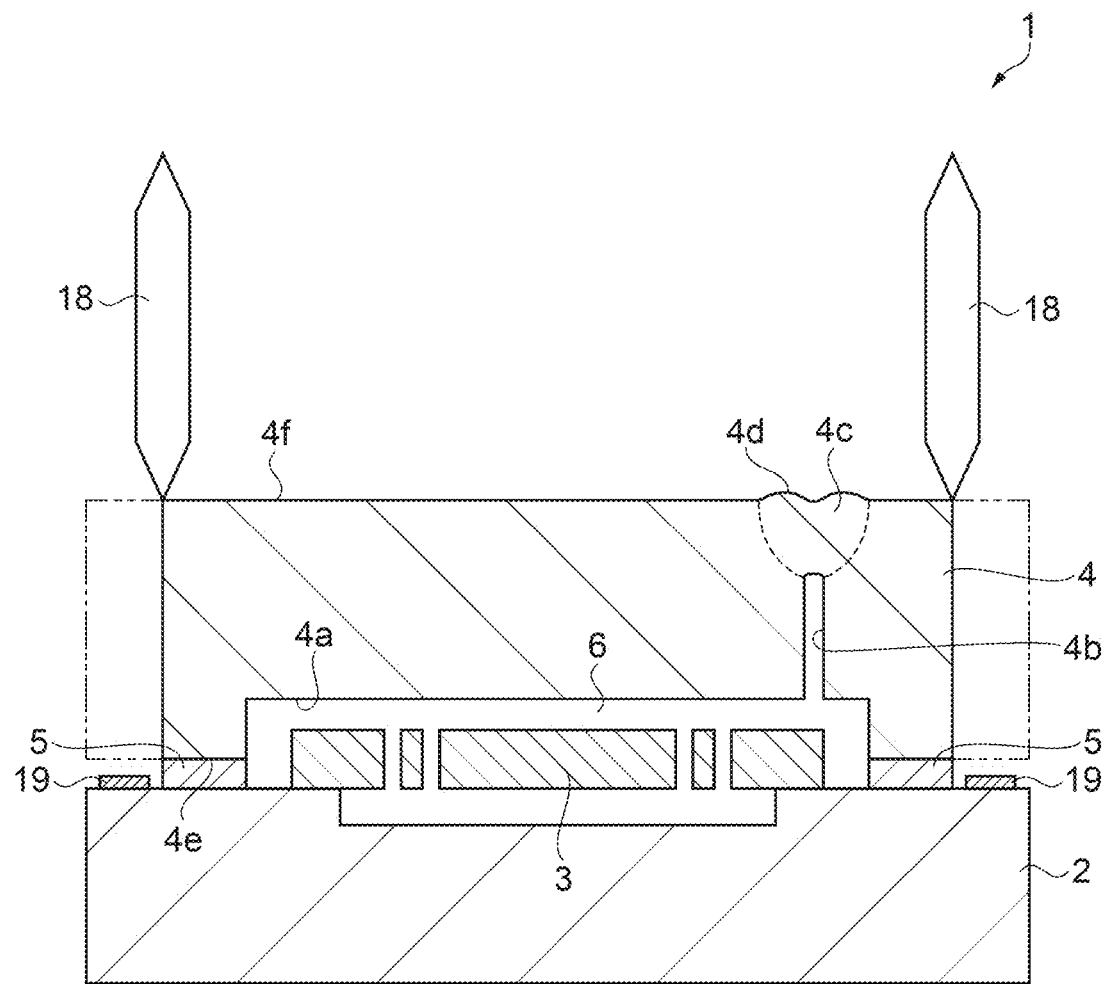
FIG. 16 is a schematic view for describing the method for manufacturing the angular velocity sensor.

Next, as shown in FIG. 16, at least one side of the lid body 4 is cut off by a dicing blade 18. The above makes it possible to expose the electrode pads 19 disposed on the base body 2. That is, wire bonding is possible. At the time, the base body 2 and the bonding layer 5 are not cut. Therefore, the space 6 can maintain good airtightness. Finally, four sides of the base body 2 are divided, and the angular velocity sensor 1 is taken out. Through the above steps, the angular velocity sensor 1 is completed.

Second Embodiment

The present embodiment is different from the first embodiment in that, an acceleration detection element is provided instead of the angular velocity detection element 3. Same components as those of the first embodiment are denoted by the same reference numerals, and redundant description thereof will be omitted.

Figure 17:
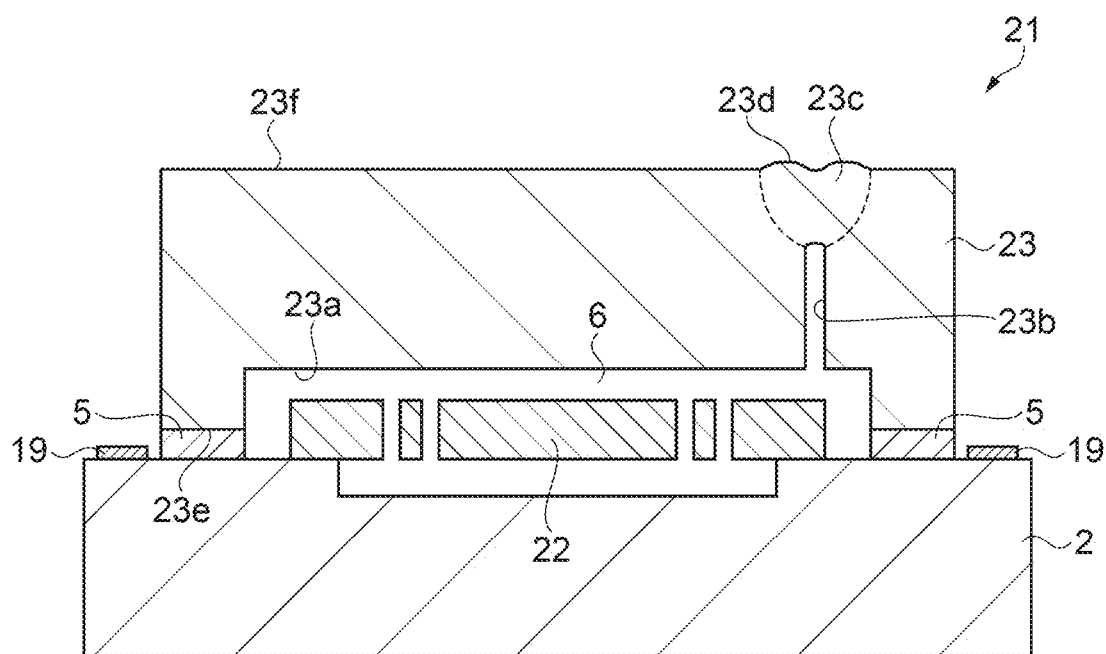
FIG. 17 is a schematic side sectional view showing a configuration of an acceleration sensor according to a second embodiment.
Figure 17:
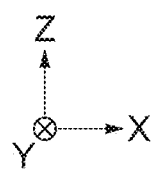

As shown in FIG. 17, an acceleration sensor 21 as a physical quantity sensor includes the base body 2. The base body 2 is provided with an acceleration detection element 22 as the movable body.

A lid body 23 is installed on the base body 2. The lid body 23 is bonded to the base body 2 by the bonding layer 5. The lid body 23 includes a first recess portion 23a on a base body 2 side. The acceleration detection element 22 is disposed in the first recess portion 23a. As described above, the acceleration sensor 21 includes the lid body 23 that accommodates the acceleration detection element 22 together with the base body 2. The acceleration detection element 22 is accommodated in the space 6 between the base body 2 and the lid body 23. A through hole 23b is provided in the lid body 23. The lid body 23 includes a melt portion 23c formed by melting the through hole 23b. The melt portion 23c closes the through hole 23b, and thus seals the space 6. The melt portion 23c includes a continuous curved surface 23d having unevenness.

Next, the acceleration detection element 22 will be described.

Figure 18:
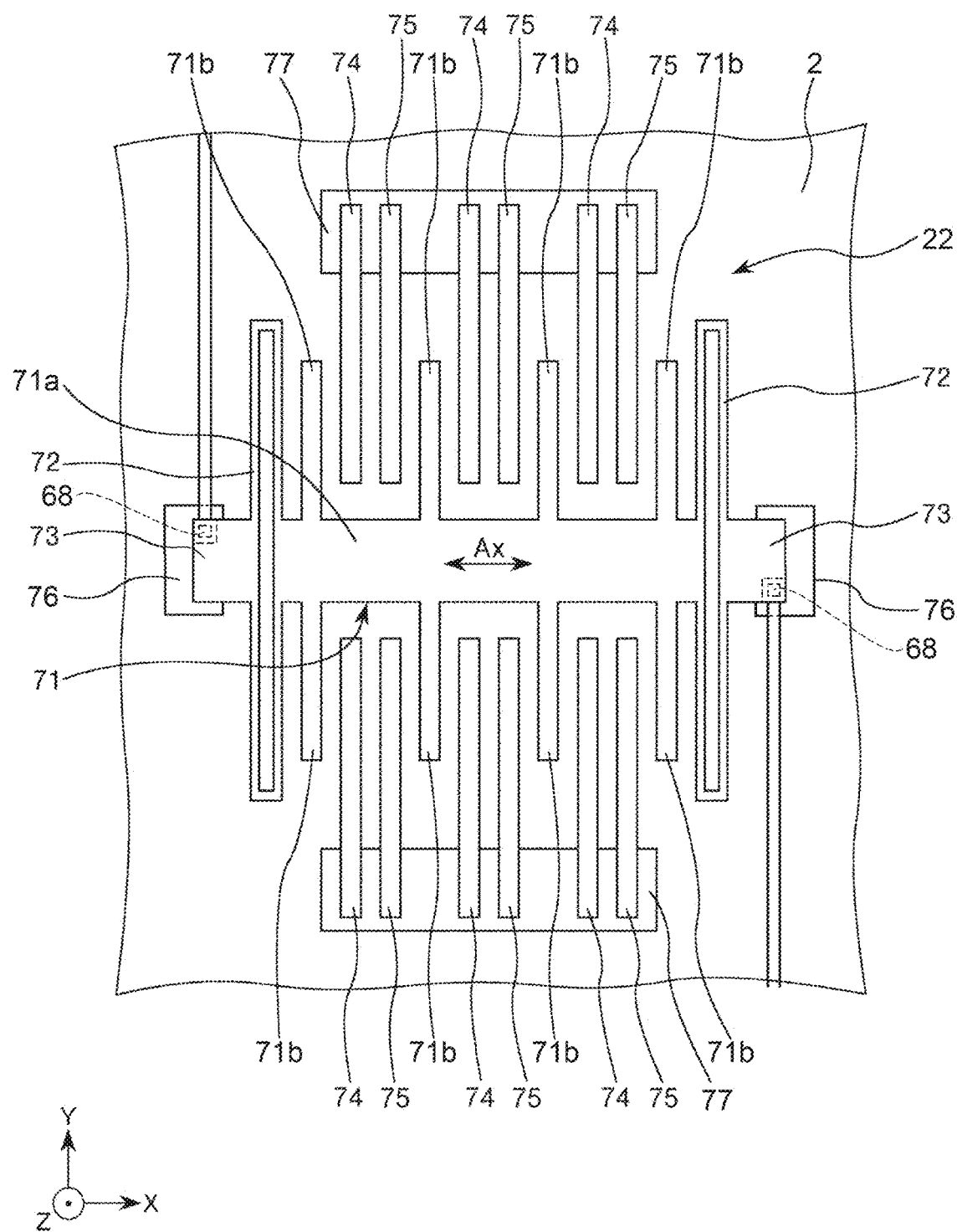
FIG. 18 is a schematic plan view showing an acceleration detection element.

The acceleration detection element 22 shown in FIG. 18 is an acceleration sensor element that detects acceleration Ax in the X direction. The base body 2 is provided with a first mount portion 76 and a second mount portion 77, and supports the acceleration detection element 22. The acceleration detection element 22 includes a movable portion 71, spring portions 72, fixed portions 73, first fixed detection electrodes 74, and second fixed detection electrodes 75.

The movable portion 71 includes a base portion 71a extending in the X direction and movable detection electrodes 71b which are a plurality of movable electrodes protruding from the base portion 71a to both sides in the Y direction. The movable portion 71 is coupled to the fixing portions 73 via the spring portions 72 at both end portions of the base portion 71a. The fixing portion 73 is fixed to the first mount portion 76 protruding from the base body 2. Accordingly, the movable portion 71 can be displaced in the X direction relative to the fixing portion 73. The first fixed detection electrode 74 and the second fixed detection electrode 75, which are fixed electrodes, are fixed to the second mount portion 77 protruding from the base body 2, and are provided with the movable detection electrode 71b interposed therebetween.

The first fixed detection electrode 74 and the second fixed detection electrode 75 are disposed between the two movable detection electrodes 71b. When the movable portion 71 is displaced in a positive X direction, the movable detection electrode 71b approaches the first fixed detection electrode 74 and is separated from the second fixed detection electrode 75. When the movable portion 71 is displaced in a negative X direction, the movable detection electrode 71b approaches the second fixed detection electrode 75 and is separated from the first fixed detection electrode 74.

The movable detection electrode 71b of the movable portion 71 is electrically coupled to a first terminal via a wiring provided on the base body 2 and a contact 68. The first fixed detection electrode 74 and a second terminal are electrically coupled to each other via the wiring. The second fixed detection electrode 75 and a third terminal are electrically coupled to each other via the wiring. Among the movable detection electrode 71b of the movable portion 71, the first fixed detection electrode 74, and the second fixed detection electrode 75, a predetermined voltage is applied via the first terminal, the second terminal, and the third terminal, and capacitances are respectively formed between the movable detection electrode 71b, and the first fixed detection electrode 74 and the second fixed detection electrode 75. Each of the first terminal, the second terminal, and the third terminal is one of the electrode pads 19.

The acceleration detection element 22 can detect the acceleration Ax in the following manner. When the acceleration Ax is applied to the acceleration detection element 22, the movable portion 71 is displaced in the X direction while elastically deforming the spring portion 72 based on a magnitude of the acceleration Ax. When the movable portion 71 is displaced, a gap between the movable detection electrode 71b and the first fixed detection electrode 74 and a gap between the movable detection electrode 71b and the second fixed detection electrode 75 change, and accordingly, the capacitance therebetween changes. Therefore, the acceleration Ax can be detected based on the change amount in the capacitance.

In FIG. 17, a through hole 23b is provided in the lid body 23, and an atmospheric pressure of the space 6 accommodating the acceleration detection element 22 can be adjusted. By adjusting the atmospheric pressure in the space 6, a damping effect of converging an amplitude of unnecessary vibration of the acceleration detection element 22 can be obtained. A damping effect must be sufficiently secured over a product life. Specifically, a sealing pressure is preferably 10,000 to 150,000 Pa using an inert gas such as nitrogen or argon. In this manner, after the pressure in the space 6 is adjusted to a pressure at which the acceleration detection element 22 is easy to operate, the through hole 23b is sealed by using the laser light 14. When the laser irradiation energy capable of melting the flat surface is set to E0, good melting can be performed by the energy amount of 0.1 to 0.5×E0.

Also in a sealing step of sealing the acceleration detection element 22, the base body 2 and the lid body 23 are heated by a heater. A heating temperature of the lid body 23 is preferably lower than that of the angular velocity detection element 3. The temperature is preferably 200° C. to 300° C., which is lower than that of the first embodiment. In the sealing step of the acceleration detection element 22, as described above, the pressure of the space 6 is set to a pressure of 10,000 to 150,000 Pa, which is higher than that when the angular velocity detection element 3 is sealed, and thus the thermal conductivity of the atmospheric gas is relatively good. Therefore, even when a temperature is set to be lower than that of the angular velocity detection element 3, the through hole 23b can be satisfactorily melted. Further, since a temperature of the lid body 23 is higher by laser melting, it is preferably to set the temperature to be slightly lower. After all laser melting steps are completed, the acceleration sensor 21 is returned to a room temperature, and then the acceleration sensor 21 is taken out from the chamber.

Similarly to the angular velocity sensor 1, the acceleration sensor 21 can suppress the occurrence of cracks in the through hole 23b. Therefore, the acceleration sensor 21 with high reliability can be manufactured.

Figure 19:
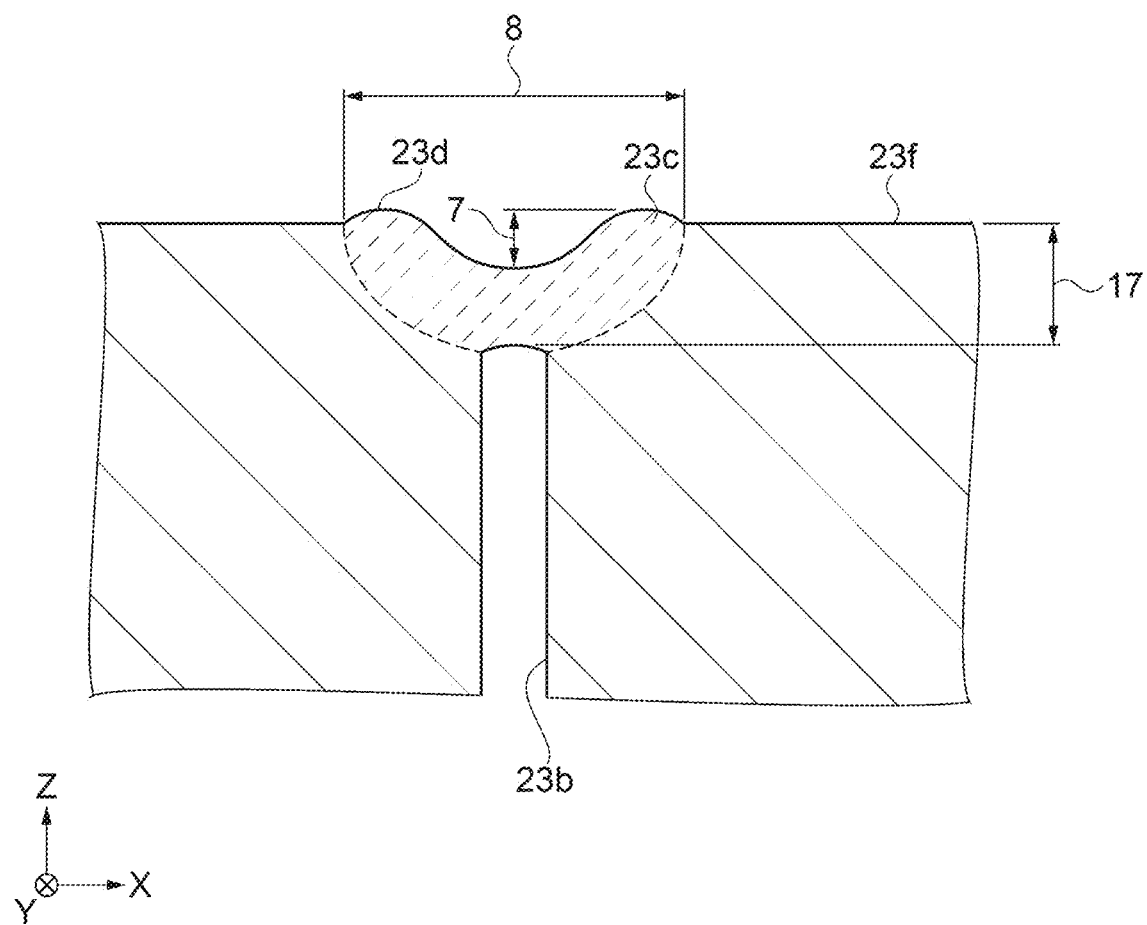
FIG. 19 is a schematic side sectional view of a main portion of a melt portion.

Next, the melt portion 23c of the lid body 23 will be described. As shown in FIG. 19, when viewed from the Z direction, the melt portion 23c has a substantially circular shape and overlaps with the through hole 23b. The melt portion 23c includes the continuous curved surface 23d having unevenness.

Although a dimension of the lid body 23 is not particularly limited, in the present embodiment, for example, a thickness of the lid body 23 is 180 μm. A depth of the first recess portion 23a is 50 μm. Therefore, the thickness of the lid body 23 in the first recess portion 23a is 130 μm.

The diameter of the through hole 23b is preferably 10 μm to 30 μm. The melt portion unevenness depth 7, which is the depth of the melt portion 23c, is 10 μm or more and 50 μm or less. The melt portion unevenness depth 7 indicates a length from a bottom of a recessed part of the melt portion 23c to the protruding part. When a beam condensing diameter of a laser light is 200 μm, a melt portion diameter of the melt portion 23c is 140 μm to 220 μm. That is, a size is 70 to 110% of the beam condensing diameter. A length from a second surface 23f to an end surface of the through hole 23b is defined as a melt portion depth 17. The melt portion depth 17 is set to D, and the melt portion diameter 8 is set to L. A D/L ratio, which is a depth diameter ratio obtained by dividing the melt portion depth 17 by the melt portion diameter 8, is preferably 0.01 or more and 0.5 or less.

Third Embodiment

The present embodiment is different from the first embodiment and the second embodiment in that the angular velocity detection element 3 and the acceleration detection element 22 are installed in the physical quantity sensor. Same components as those in the first embodiment and the second embodiment are denoted by the same reference numerals, and redundant description thereof will be omitted.

Figure 20:
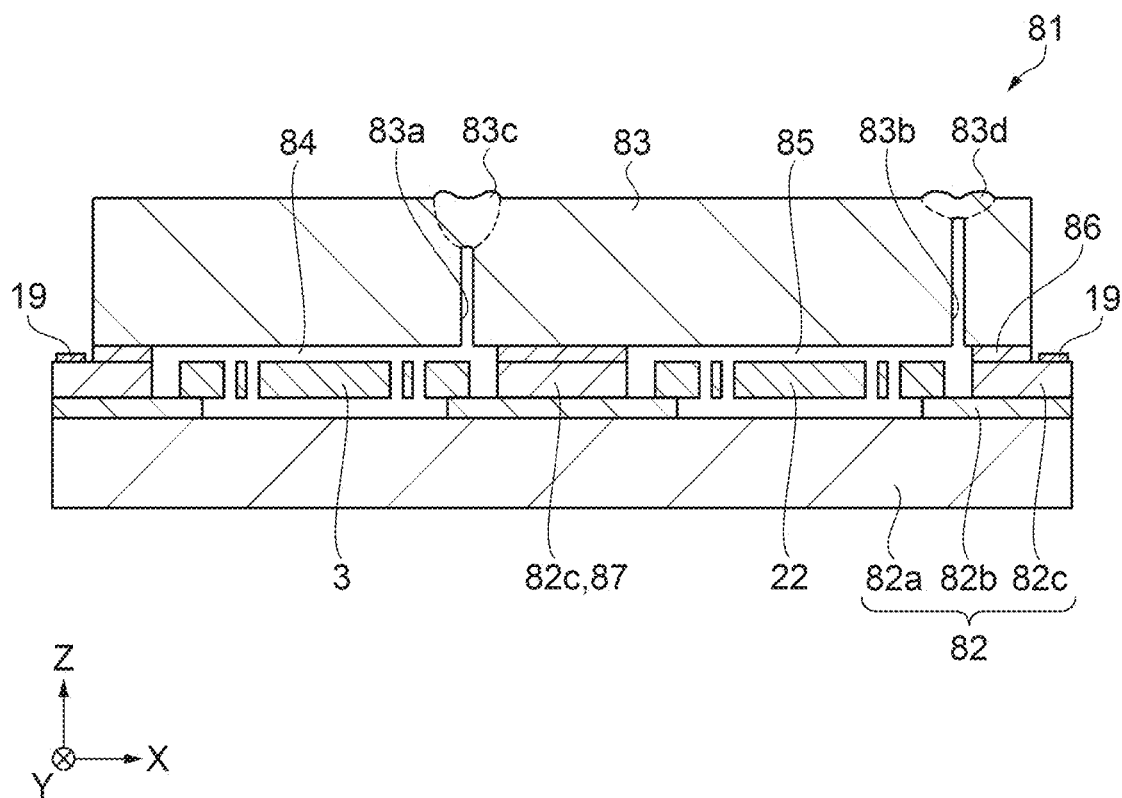
FIG. 20 is a schematic side sectional view showing a configuration of an inertial sensor according to a third embodiment.

As shown in FIG. 20, an inertial sensor 81 as a physical quantity sensor includes a base body 82. The base body 82 includes a silicon substrate 82a, a silicon oxide layer 82b, and a polycrystalline silicon layer 82c. The silicon oxide layer 82b is stacked on the silicon substrate 82a. The polycrystalline silicon layer 82c is stacked on the silicon oxide layer 82b. The angular velocity detection element 3 and the acceleration detection element 22 are provided on the silicon oxide layer 82b.

The inertial sensor 81 includes a lid body 83 that accommodates the angular velocity detection element 3 and the acceleration detection element 22 together with a base body 82. The lid body 83 is bonded to the base body 82 via a bonding layer 86. The angular velocity detection element 3 is accommodated in a first space 84 as a space between the base body 82 and the lid body 83. The acceleration detection element 22 is accommodated in a second space 85 as a space between the base body 82 and the lid body 83. At the time, no recess portion is provided on a surface of the lid body 83 facing the angular velocity detection element 3 and the acceleration detection element 22.

The lid body 83 is provided with a first through hole 83a as a through hole and a second through hole 83b as a through hole. The lid body 83 includes a first melt portion 83c as a melt portion obtained by melting the first through hole 83a. The first melt portion 83c seals the first space 84 by closing the first through hole 83a. The lid body 83 includes a second melt portion 83d as a melt portion obtained by melting the second through hole 83b. The second melt portion 83d seals the second space 85 by closing the second through hole 83b. A partition wall 87 is disposed between the first space 84 and the second space 85.

The first through hole 83a and the first melt portion 83c correspond to the through hole 4b and the melt portion 4c according to the first embodiment, respectively. A shape of the first melt portion 83c is substantially the same as that of the melt portion 4c. The first space 84 and the angular velocity detection element 3 are substantially the same as the space 6 and the angular velocity detection element 3 according to the first embodiment, respectively. The air pressure in the first space 84 is substantially the same as the air pressure in the space 6 according to the first embodiment.

The second through hole 83b and the second melt portion 83d correspond to the through hole 23b and the melt portion 23c according to the second embodiment, respectively. A shape of the second melt portion 83d is substantially the same as that of the melt portion 23c. The second space 85 and the acceleration detection element 22 are substantially the same as the space 6 and the acceleration detection element 22 according to the second embodiment, respectively. The air pressure in the second space 85 is substantially the same as the air pressure in the space 6 according to the second embodiment. A reason why depths of the first melt portion 83c and the second melt portion 83d are different from each other is that laser irradiation energies are different from each other.

Next, a method for manufacturing the inertial sensor 81 will be described.

Figure 21:
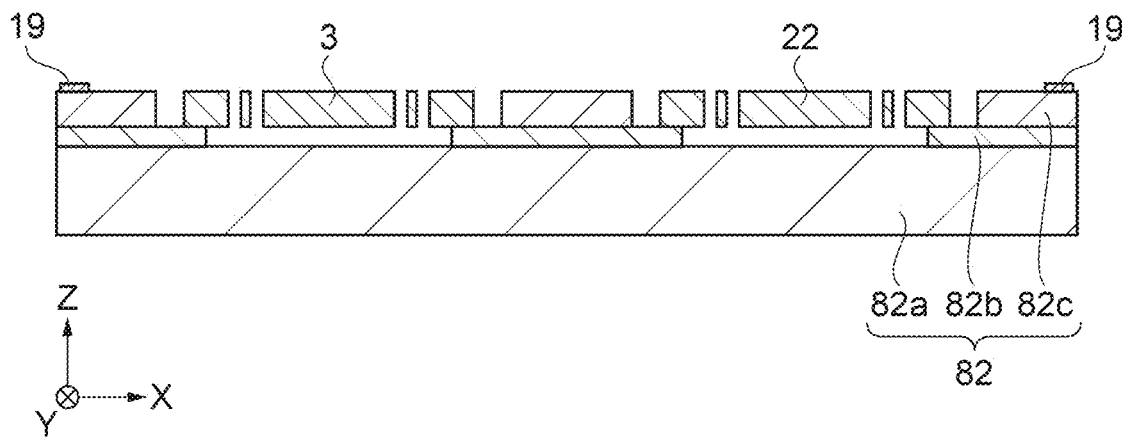
FIG. 21 is a schematic view for describing a method for manufacturing the inertial sensor.

In FIG. 21, the silicon substrate 82a is prepared. The silicon oxide layer 82b as a sacrificial layer and the polycrystalline silicon layer 82c as an element layer are formed on the silicon substrate 82a. A lower electrode layer (not shown) may be formed under the silicon oxide layer 82b. At the time, silicon nitride which is to be an etching stop layer is formed on a lower surface. A thickness of the silicon oxide layer 82b is 2 μm or less, and a thickness of the polycrystalline silicon layer 82c is about 15 μm to 30 μm. A sputtering method, a vapor deposition method, or a CVD method is used to form the layers. Patterning is performed by a photolithography method, and the angular velocity detection element 3 and the acceleration detection element 22 are formed by using the Bosch method. At this time, the polycrystalline silicon layer 82c fixed to the silicon substrate 82a serving as a part of the partition wall is left between the elements, such that the first space 84 and the second space 85 do not communicate with each other. Then, the silicon oxide layer 82b is released by an HF vapor. The base body 82 is provided with a plurality of physical quantity sensors such as the angular velocity detection element 3 and the acceleration detection element 22.

Figure 22:
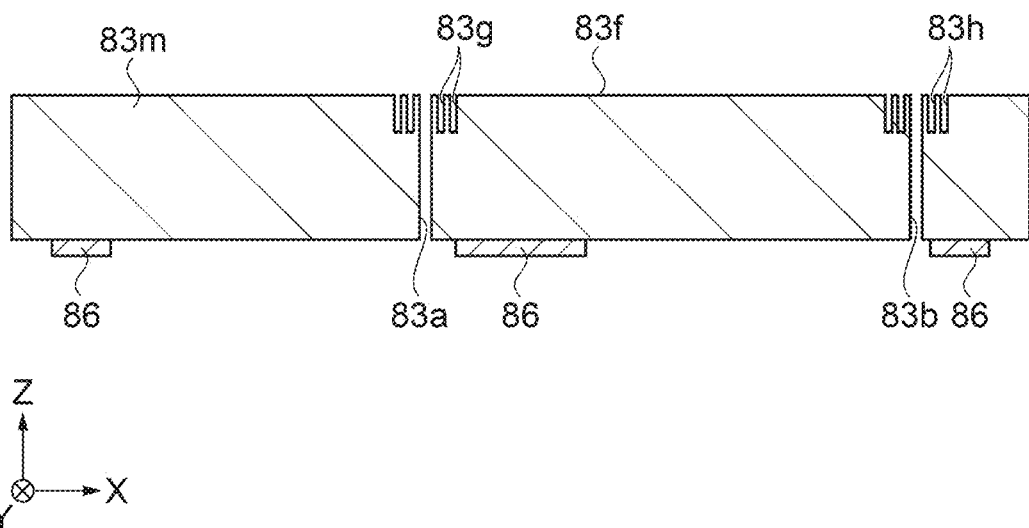
FIG. 22 is a schematic view for describing the method for manufacturing the inertial sensor.

In FIG. 22, a substrate 83m as a material of the lid body 83 is prepared. The substrate 83m has a (100) plane made of silicon. A surface of the substrate 83m opposite to the base body 82 is referred to as a second surface 83f. A first through hole 83a, a second through hole 83b, a third recess portion 83g, and a fourth recess portion 83h are formed in the second surface 83f by the Bosch process. The third recess portion 83g and the fourth recess portion 83h correspond to the second recess portion 4g according to the first embodiment.

Etching depths of the first through hole 83a, the second through hole 83b, the third recess portion 83g and the fourth recess portion 83h may be controlled by using a micro loading effect or by adjusting the thickness of the mask. Next, the bonding layer 86 is formed on the substrate 83m. Although the bonding layer 86 is printed on an entire wafer on a substrate 83m side using a screen printing technique, the bonding layer 86 may be formed on a polycrystalline silicon layer 82c side of the base body 82. The bonding layer 86 may be made of a low melting point alloy such as AlGe. In order to separate a sealing atmosphere between the first space 84 and the second space 85, the bonding layer 86 is also formed in a partition wall 87 portion.

Figure 28:
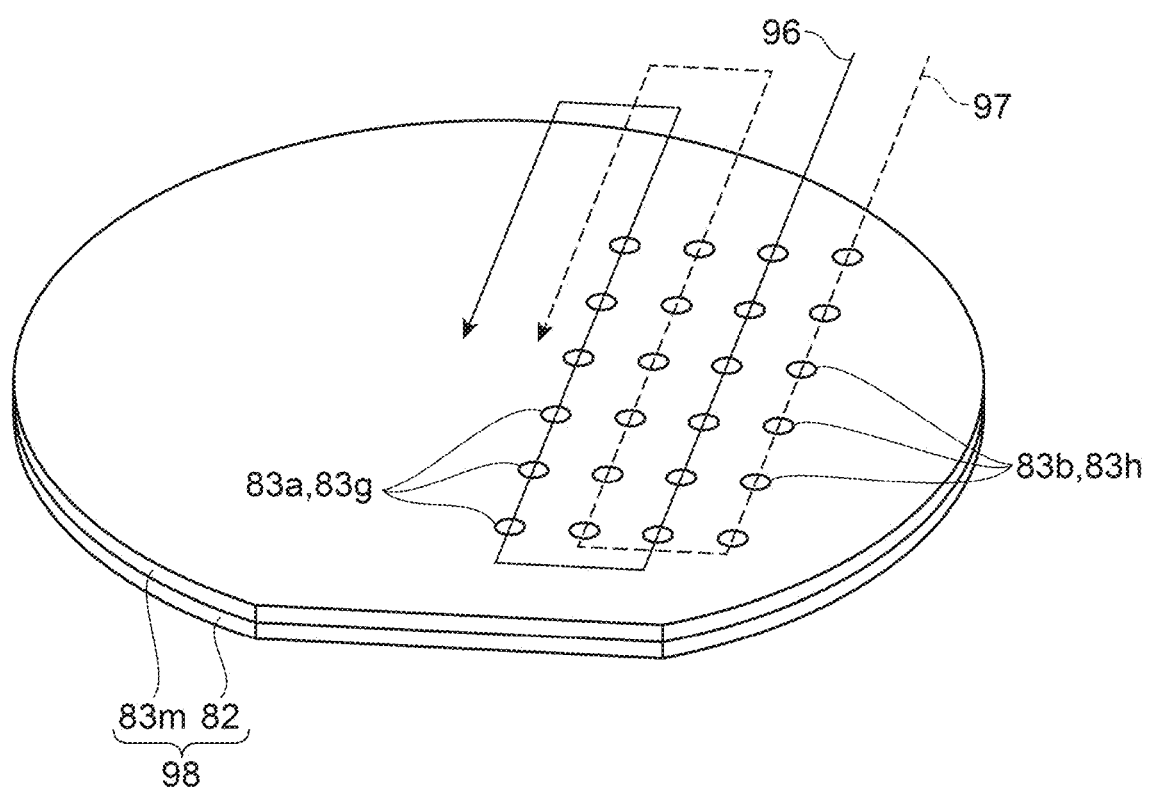
FIG. 28 is a schematic view for describing the method for manufacturing the inertial sensor.

A plurality of first spaces 84 and a plurality of second spaces 85 are provided between the base body 82 and the substrate 83m. The first space 84 is provided corresponding to at least one angular velocity detection element 3. The first through hole 83a and the third recess portion 83g are provided corresponding to one first space 84. The second space 85 is provided corresponding to at least one acceleration detection element 22. The second through hole 83b and the fourth recess portion 83h are provided corresponding to one second space 85. Therefore, as shown in FIG. 28, a plurality of first through holes 83a are provided in the substrate 83m. As shown in FIG. 28, a plurality of second through holes 83b are provided in the substrate 83m.

Figure 23:
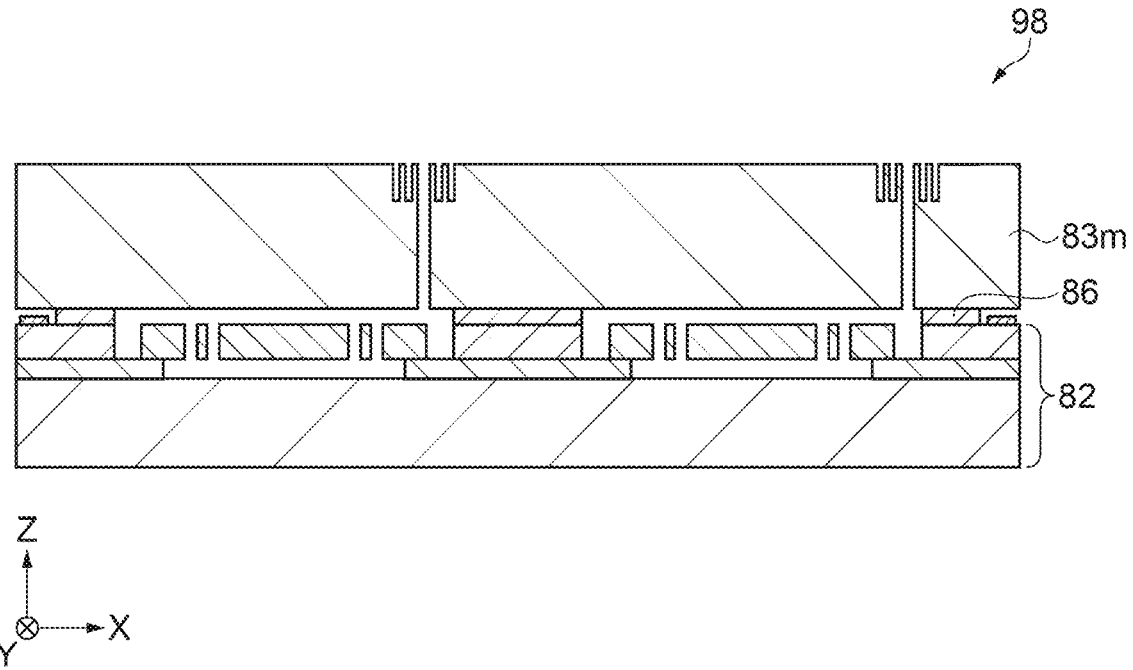
FIG. 23 is a schematic view for describing the method for manufacturing the inertial sensor.

In FIG. 23, the substrate 83m and the base body 82 are bonded to each other by pressurization and heating. A pressure at the time of bonding is 10 kPa to 1000 kPa. Heating at the time of bonding is performed in a range of 250° C. to 500° C. The atmosphere at the time of bonding may be an atmosphere of an inert gas such as nitrogen gas or argon gas, and may be a vacuum, an air pressure, or a positive pressure. The substrate 83m is bonded to the polycrystalline silicon layer 82c using an AlGe material to be the bonding layer 86. Although in the present embodiment, metal eutectic bonding using an AlGe material is used, anodic bonding, direct bonding, glass frit bonding, or plasma activation bonding may be used. The first through hole 83a, the second through hole 83b, the third recess portion 83g, and the fourth recess portion 83h may be formed after the substrate 83m and the base body 82 are bonded to each other. A substrate to which the base body 82 and the substrate 83m are bonded is referred to as a bonded substrate 98.

Figure 24:
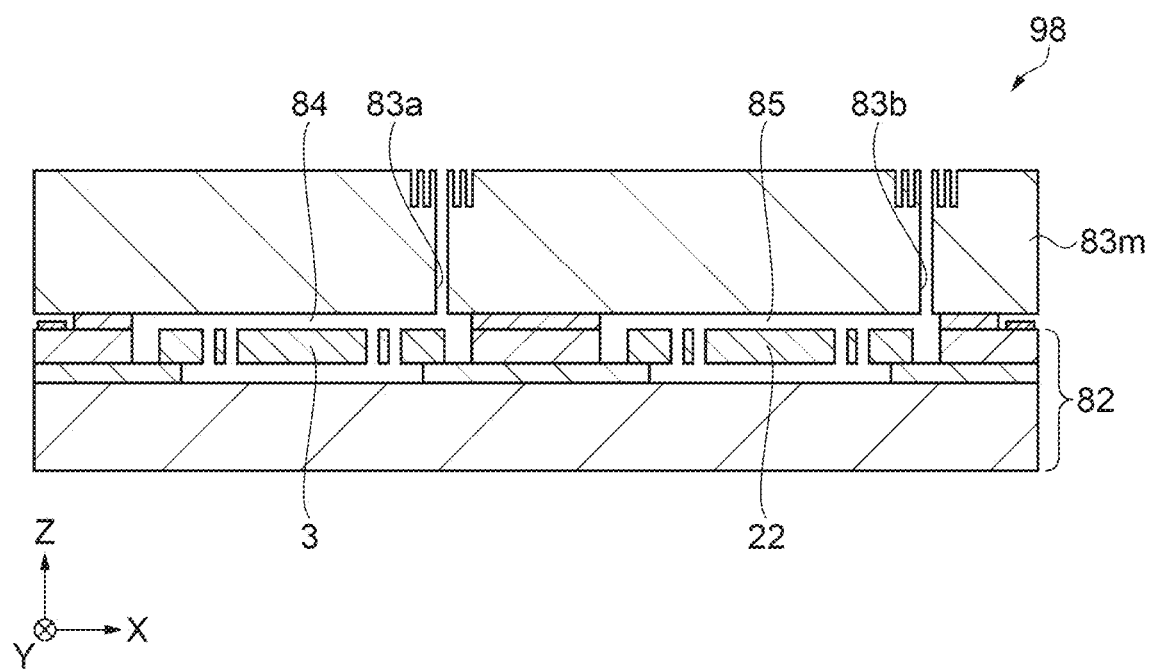
FIG. 24 is a schematic view for describing the method for manufacturing the inertial sensor.

In FIG. 24, degassing treatment is performed by vacuum heating treatment. Specifically, heating is performed at a temperature of 250° C. to 300° C. and an air pressure of 100 Pa or less for several hours. A gas in the first space 84 is taken out from the first through hole 83a to an outside. A gas in the second space 85 is taken out from the second through hole 83b to the outside.

Next, hydrophobic treatment of the first space 84 and the second space 85 is performed. In the hydrophobic treatment, HMDS, which is a silane coupling agent, was used. By such a hydrophobic treatment, a moisture content of the first space 84 and the second space 85 can be reduced to 100 ppm or less. Therefore, the angular velocity detection element 3 and the acceleration detection element 22 can be operated favorably without being affected by a fluctuation of an atmospheric gas pressure due to moisture.

Figure 25:
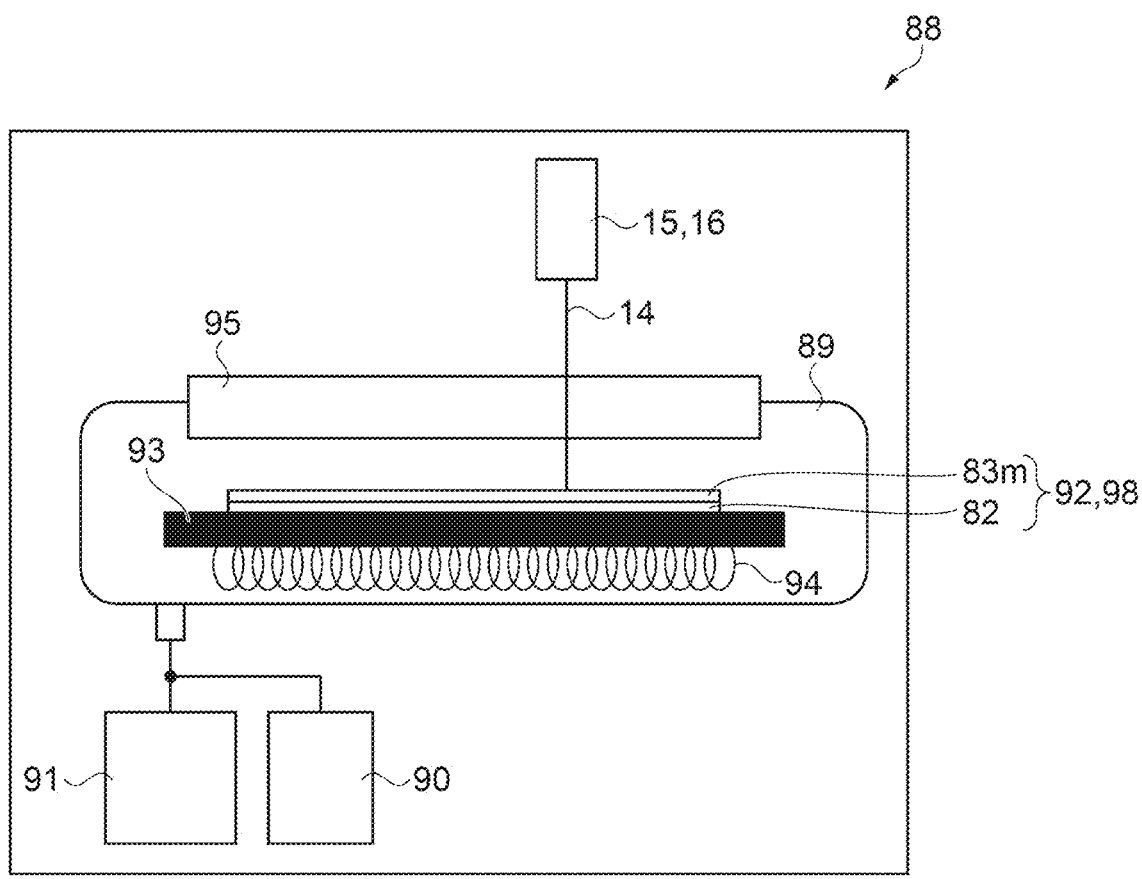
FIG. 25 is a block diagram showing a configuration of a laser sealing device.

A laser sealing device 88 as shown in FIG. 25 is prepared. The laser sealing device 88 includes a chamber 89. The laser sealing device 88 includes a rotary pump 90 and a turbomolecular pump 91 that depressurize an inside of the chamber 89. An XY stage 93 for moving an object to be processed 92 is disposed inside the chamber 89. The XY stage 93 has a role of moving the object to be processed 92 and matching an irradiation position of the laser light 14 emitted from the laser light source 15 with an appropriate position. The laser light source 15 may be moved instead of the XY stage 93. A sheath heater 94 for heating the object to be processed 92 is disposed inside the chamber 89. The object to be processed 92 corresponds to the bonded substrate 98. The sheath heater 94 heats the substrate 83m via the base body 82 in the bonded substrate 98. At the time, the sheath heater may be any heater as long as the heater can heat the bonding substrate 98, and a halogen heater may be used instead of the sheath heater. Further, since the substrate 83m is to be heated, the bonded substrate 98 may be heated from the substrate 83m side in the bonded substrate 98.

A window portion 95 is provided on one surface of the chamber 89. The window portion 95 includes sapphire glass. An anti-reflective (AR) coating is applied to a surface of the sapphire glass. The laser light source 15 is installed outside the chamber 89, and the laser light source 15 irradiates the object to be processed 92 by the condensed laser light 14. Since a material transparent with respect to the laser light source 15 is suitable for the window portion 95, the sapphire glass is selected for the window 95.

Figure 26:
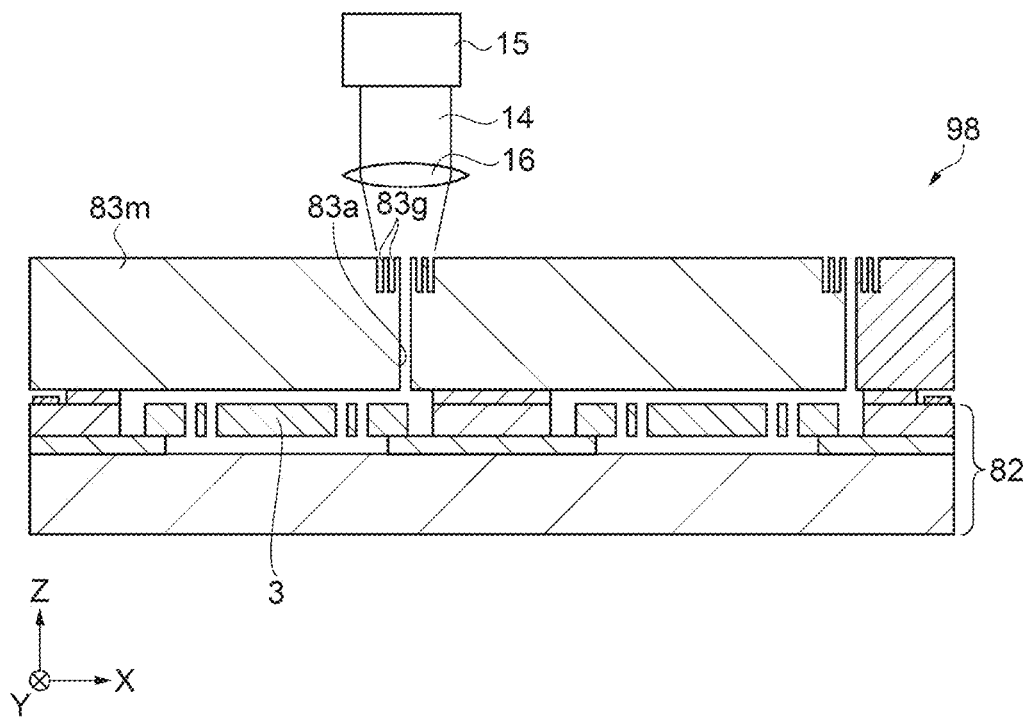
FIG. 26 is a schematic view for describing the method for manufacturing the inertial sensor.

In FIG. 26, the bonded substrate 98 is installed in the chamber 89, vacuuming was performed, and the bonded substrate 98 is heated to a predetermined temperature T1 by the sheath heater 94. When a vacuum degree is 100 Pa or less and a temperature of the substrate 83m reaches T1 after waiting for 10 minutes or more, the first through hole 83a and the third recess portion 83g on the angular velocity detection element 3 side are irradiated by the laser light 14 and thereby melted. Since the temperature cannot be easily transmitted in a vacuum state, the temperature T1 is preferably 300° C. to 400° C., which is relatively high. The first through hole 83a and the third recess portion 83g form the first melt portion 83c.

Figure 27:
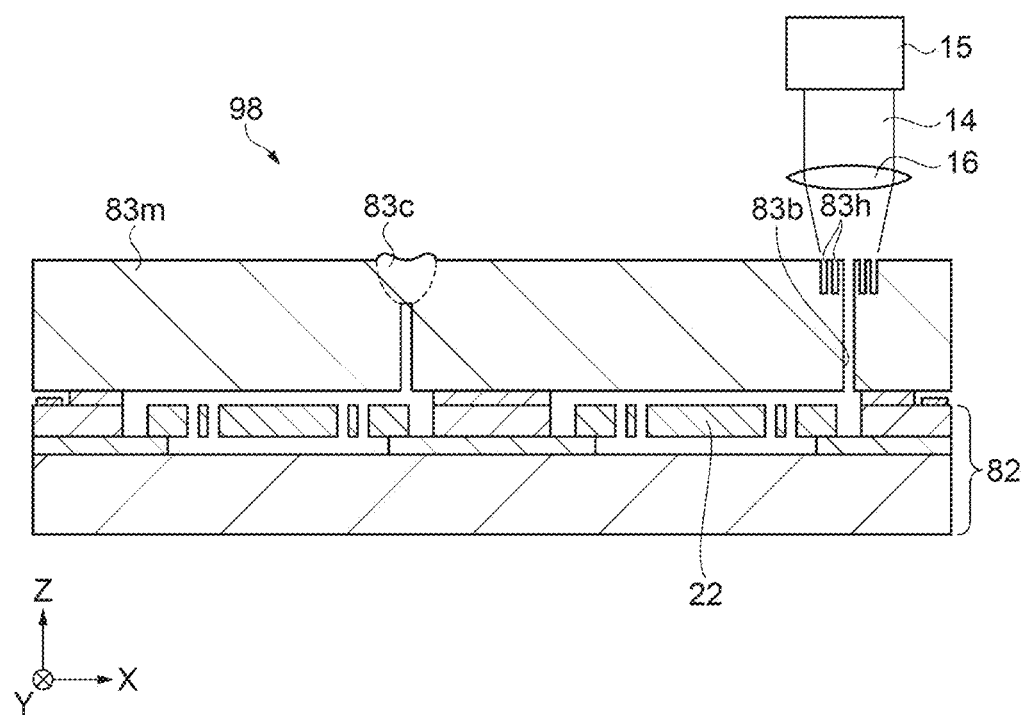
FIG. 27 is a schematic view for describing the method for manufacturing the inertial sensor.

Next, as shown in FIG. 27, inert gas such as nitrogen gas is introduced into the chamber 89 while the bonded substrate 98 is placed in the chamber 89, and the temperature of the bonded substrate 98 is controlled to T2. Since a thermal conductivity of the nitrogen gas is good when the air pressure in the chamber 89 is 100 Pa or more, the heating temperature may be 300° C. or less.

The second through hole 83b and the fourth recess portion 83h on the acceleration detection element 22 side are irradiated with the laser light 14 and thereby melted. An irradiation energy may be lower than that in a case of the first through hole 83a on the angular velocity detection element 3 side. Therefore, dross, debris, cracks, and the like are less likely to occur. The second through hole 83b and the fourth recess portion 83h form the second melt portion 83d.

After melting of all second through holes 83b on the wafer is completed, a temperature in the chamber 89 is returned to a room temperature. The bonded substrate 98 is taken out from the chamber 89.

FIG. 28 shows a trajectory of the laser light 14. In the substrate 83m, the first through holes 83a and the third recess portions 83g are disposed on a plurality of parallel lines. The first trajectory 96 is along a plurality of arrangements in which the first through holes 83a and the third recess portions 83g are disposed. In a step of forming the first melt portion 83c shown in FIG. 26, the temperature of the bonded substrate 98 is maintained at T1, and the laser light 14 moves along the first trajectory 96. The laser light 14 may be continuously irradiated on the first trajectory 96, or may be irradiated only when the laser light 14 passes through a region of the first through holes 83a and the third recess portions 83g. That is, the laser light 14 may be radiated discontinuously in a pulsed manner on the first trajectory 96.

Similarly, in the substrate 83m, the second through holes 83b and the fourth recess portions 83h are disposed on a plurality of parallel lines. The second trajectory 97 is along a plurality of arrangements in which the second through holes 83b and the fourth recess portions 83h are disposed. In a step of forming the second melt portion 83d shown in FIG. 27, the temperature of the bonded substrate 98 is maintained at T2, and the laser light 14 moves along the second trajectory 97. The laser light 14 may be continuously radiated on the second trajectory 97, or may be radiated only when the laser light 14 passes through a region of the second through holes 83b and the fourth recess portions 83h. That is, the laser light 14 may be radiated discontinuously in a pulsed manner on the second trajectory 97.

In both the process of forming the first melt portion 83c and the process of forming the second melt portion 83d, the base body 82 is installed in the same chamber 89. The air pressure, the temperature, and a type of gas are changed. It takes time to change the inside of the chamber 89 from air pressure, normal temperature, and air to predetermined air pressure, temperature, and type of gas. Therefore, the first melt portion 83c and the second melt portion 83d can be formed with higher productivity than in a method of taking out the bonded substrate 98 from the chamber 89 after the first melt portion 83c is formed and putting the bonded substrate 98 into another chamber 89 to form the second melt portion 83d.

Figure 29:
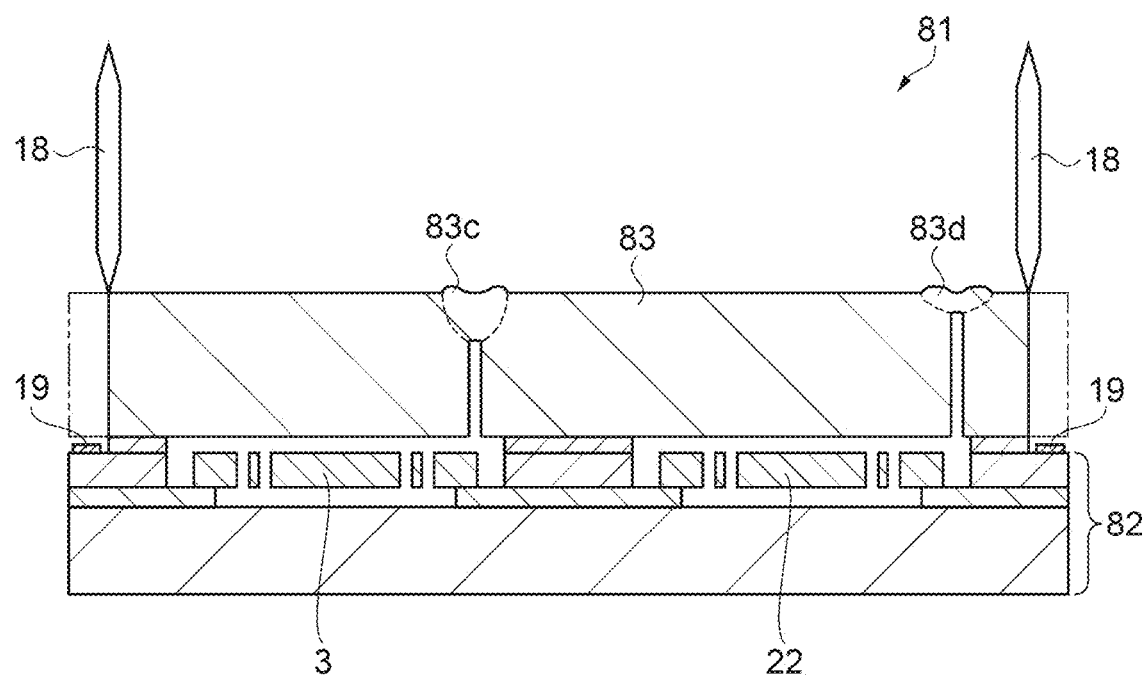
FIG. 29 is a schematic view for describing the method for manufacturing the inertial sensor.

As shown in FIG. 29, the bonded substrate 98 is taken out from the chamber 89, and at least one side of the bonded substrate 98 is cut out by half dicing by using the dicing blade 18. In this way, the electrode pad 19 is exposed, and the wire bonding is possible. Thereafter, the four sides of the bonded substrate 98 are cut, and the inertial sensor 81 in which the angular velocity detection element 3 and the acceleration detection element 22 are mixedly mounted is completed. A reason why depths of the first melt portion 83c and the second melt portion 83d are different from each other is that laser irradiation energies are different from each other.

Fourth Embodiment

In the present embodiment, an example of an inertial measurement unit 2000 on which the angular velocity sensor 1, the acceleration sensor 21, or the inertial sensor 81 described above are mounted will be described.

Figure 30:
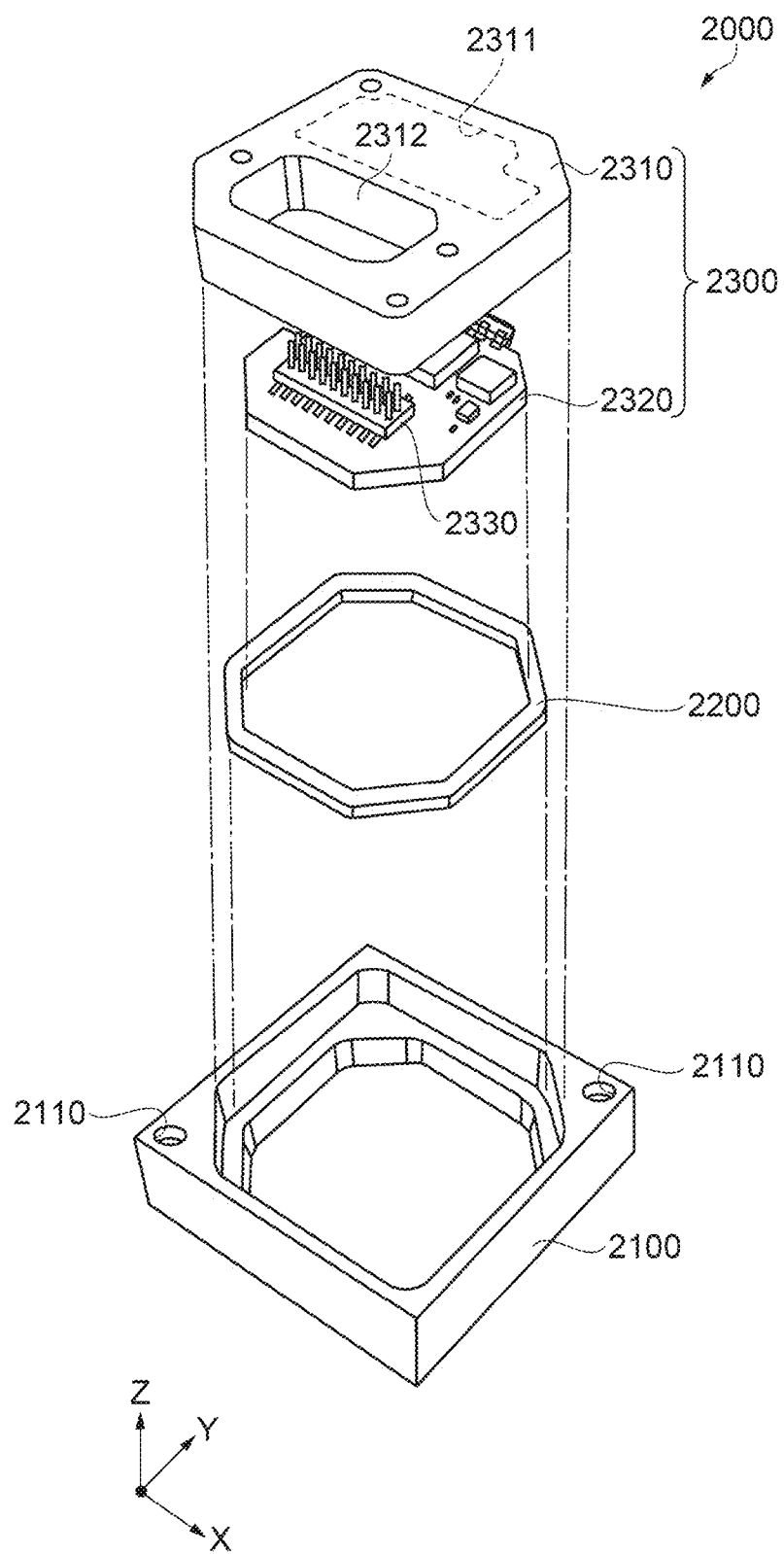
FIG. 30 is a schematic perspective view showing a configuration of an inertial measurement unit according to a fourth embodiment.

The inertial measurement unit 2000 shown in FIG. 30 is a device that detects an inertial motion amount such as a posture or a behavior of a moving body such as an automobile or a robot. The inertial measurement unit 2000 is also referred to as an inertial measurement unit (IMU). The inertial measurement unit 2000 functions as a so-called six-axis motion sensor including an acceleration sensor 21 that detects accelerations Ax, Ay, and Az in directions along three axes and an angular velocity sensor 1 that detects angular velocities ωx, ωy, and ωz around of the three axes.

The inertial measurement unit 2000 is a rectangular parallelepiped having a substantially square planar shape. Screw holes 2110 are formed in the vicinity of vertexes at two locations located in a diagonal direction of the square. The inertial measurement unit 2000 can be fixed to a mounted surface of a mounted body such as an automobile by passing two screws through the two screw holes 2110. It is also possible to reduce a size to a size that can be mounted on a smartphone or a digital camera, for example, by selecting a component or changing a design.

The inertial measurement unit 2000 includes an outer case 2100, a bonding member 2200, and a sensor module 2300, and has a configuration in which the sensor module 2300 is inserted inside the outer case 2100 with the bonding member 2200 interposed therebetween. The sensor module 2300 includes an inner case 2310 and a substrate 2320.

Similarly to an overall shape of the inertial measurement unit 2000, the outer case 2100 has an outer shape of a rectangular parallelepiped having a substantially square planar shape, and the screw holes 2110 are formed in the vicinity of two vertices at two positions located in a diagonal direction of the square, respectively. The outer case 2100 has a box shape, and the sensor module 2300 is accommodated inside the outer case 2100.

The inner case 2310 is a member that supports the substrate 2320, and has a shape that fits inside the outer case 2100. The inner case 2310 is formed with a recess portion 2311 for preventing contact with the substrate 2320 and an opening 2312 for exposing a connector 2330. Thereby, the inner case 2310 is bonded to the outer case 2100 via the bonding member 2200. The substrate 2320 is bonded to a lower surface of the inner case 2310 via an adhesive.

Figure 31:
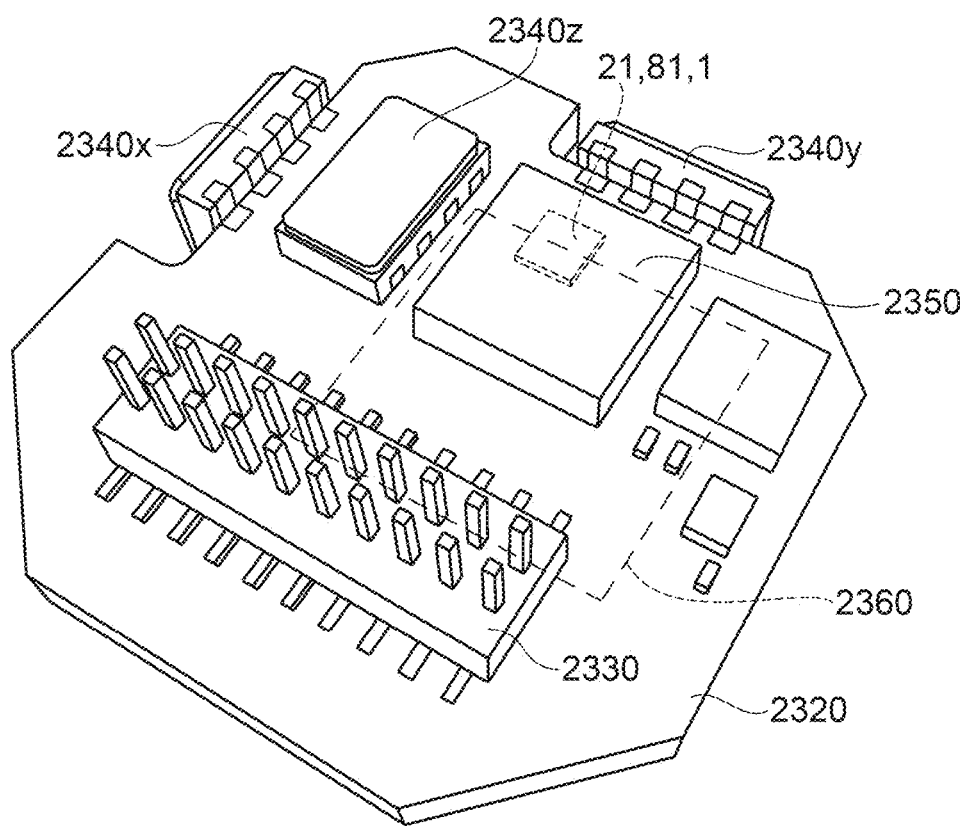
FIG. 31 is a schematic perspective view showing a configuration of a substrate.

As shown in FIG. 31, a connector 2330, an angular velocity sensor 2340z that detects an angular velocity around a Z axis, an acceleration sensor unit 2350 that detects acceleration in each axial direction of an X axis, a Y axis, and the Z axis, and the like are mounted on an upper surface of the substrate 2320. An angular velocity sensor 2340x that detects an angular velocity around the X axis and an angular velocity sensor 2340y that detects an angular velocity around the Y axis are mounted on a side surface of the substrate 2320.

The acceleration sensor unit 2350 can detect acceleration in one axial direction, acceleration in two axial directions, or acceleration in three axial directions, as necessary.

A control IC 2360 is mounted at a lower surface of the substrate 2320. The control IC 2360 that performs control based on a detection signal output from each sensor is a micro controller unit (MCU), includes a storage unit including a nonvolatile memory, an A/D converter, and the like, and controls units of the inertial measurement unit 2000. The storage unit stores a program defining an order and a content for detecting an acceleration and an angular velocity, a program for digitizing detection data and incorporating digitized detection data into packet data, accompanying data, and the like. A plurality of electronic components are mounted on the substrate 2320.

The angular velocity sensor 1 or the inertial sensor 81 is used for the angular velocity sensor 2340z, the angular velocity sensor 2340x, and the angular velocity sensor 2340y. The acceleration sensor 21 or the inertial sensor 81 is used for the acceleration sensor unit 2350.

Therefore, the inertial measurement unit 2000 includes the angular velocity sensor 1, the acceleration sensor 21, or the inertial sensor 81 described above. According to the configuration, the inertial measurement unit 2000 includes the angular velocity sensor 1, the acceleration sensor 21, or the inertial sensor 81 described above. The angular velocity sensor 1, the acceleration sensor 21, or the inertial sensor 81 has a structure in which a crack is unlikely to occur in the lid body 4, the lid body 23, or the lid body 83. Therefore, the inertial measurement unit 2000 can be an inertial measurement unit 2000 including a physical quantity sensor in which a crack is unlikely to occur in the lid body 4, the lid body 23, or the lid body 83.

Fifth Embodiment

In the first embodiment, the second recess portion 4g is constituted by the first groove 9 and the second groove 10 which are concentric with the through hole 4b in a plan view seen from the Z direction.

Figure 32:
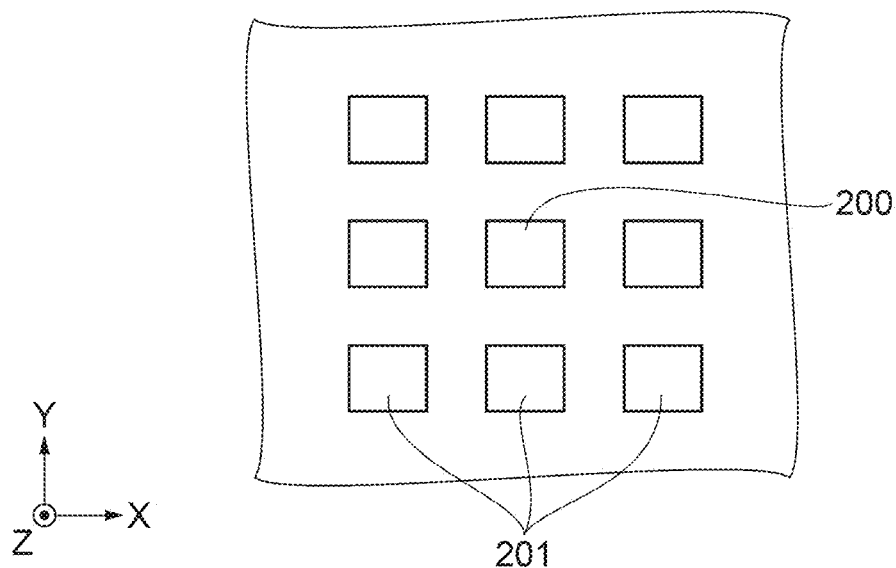
FIG. 32 is a schematic plan view of a main portion showing an arrangement of through holes and recess portions according to a fifth embodiment.

As shown in FIG. 32, a through hole 200 corresponding to the through hole 4b in a plan view viewed from the Z direction may be a quadrangle. A recess portion 201 corresponding to the second recess portion 4g in a plan view viewed from the Z direction may also be quadrangular. The recess portion 201 is disposed in the periphery of the through hole 200. At the time, since a part of the laser light 14 is diffracted in the recess portion 201, the laser light 14 travels in multiple directions in the periphery of the through hole 200. Therefore, since a change in the residual stress at the melt portion 4c is gentle, an occurrence of cracks can be inhibited. In addition, a shape of the through hole 200 and the recess portion 201 in a plan view viewed from the Z direction may be a rhombus, a triangle, or a checkered pattern.

Figure 33:
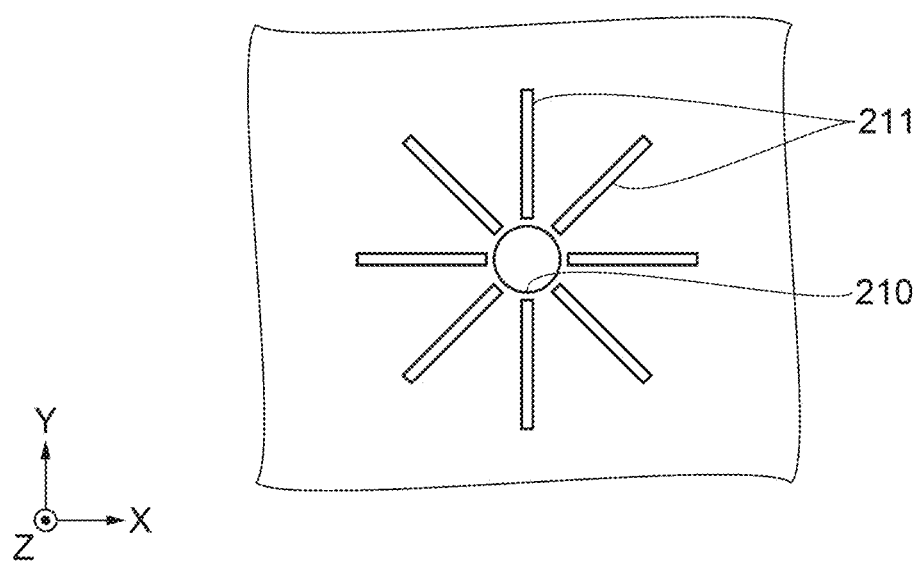
FIG. 33 is a schematic plan view of the main portion showing the arrangement of the through holes and the recess portions.

As shown in FIG. 33, a through hole 210 corresponding to the through hole 4b in a plan view viewed from the Z direction may be a quadrangle. A recess portion 211 corresponding to the second recess portion 4g in a plan view viewed from the Z direction may have a radial rectangular shape extending from the through hole 210. The recess portion 211 is disposed in the periphery of the through hole 210. At the time, since a part of the laser light 14 is diffracted in the recess portion 211, the laser light 14 travels in multiple directions in the periphery of the through hole 210. Therefore, since a change in the residual stress at the melt portion 4c is gentle, an occurrence of cracks can be inhibited. In addition, the recess portion corresponding to the second recess portion 4g in a plan view viewed from the Z direction may have a spiral shape.

What is claimed is:

1. A physical quantity sensor comprising:
   a movable body;
   a base; and
   a lid, the lid being formed of a first material and having an upper major surface, an opposite lower major surface that faces the base, and a plurality of side surfaces that connect the upper major surface to the opposite lower major surface, wherein
   the movable body is housed in a space between the base and the lid,
   the space is sealed by sealing a through hole provided in the lid with a melt portion, the melt portion being formed of the first material,
   the melt portion is substantially circular in a plan view, and includes an annular surface that convexly extends outward from the upper major surface, and
   a center of the annular surface is concave in a cross-sectional view.

2. The physical quantity sensor according to claim 1, wherein
   the lid is formed of a single crystal material, and
   the melt portion is polycrystalline.

3. The physical quantity sensor according to claim 1, wherein
   the lid is formed of silicon.

4. The physical quantity sensor according to claim 1, wherein
   the melt portion is formed by irradiating a plurality of concentric grooves formed around the through hole of the lid with a laser beam to melt the lid.

5. The physical quantity sensor according to claim 1, wherein
   a first surface of the lid faces the base,
   a second surface of the lid is opposite to the first surface, and $0.50 \leq D/L \leq 3.00$, wherein D is a length from the second surface to an end of the melt portion nearest the first surface, and L is a diameter of the melt portion nearest the second surface in the plan view.

6. The physical quantity sensor according to claim 1, wherein
   a first surface of the lid faces the base,
   a second surface of the lid is opposite to the first surface, and $0.01 \leq D/L \leq 0.50$, wherein D is a length from the second surface to an end of the melt portion nearest the first surface, and L is a diameter of the melt portion nearest the second surface in the plan view.

7. The physical quantity sensor according to claim 1, wherein
   a pressure of the space is 0.1 Pa to 10 Pa.

8. The physical quantity sensor according to claim 1, wherein
   a pressure of the space is 10,000 to 150,000 Pa.

9. The physical quantity sensor according to claim 1, wherein
   the space is filled with an inert gas.

10. The physical quantity sensor according to claim 9, wherein
    the inert gas is nitrogen or argon.

11. The physical quantity sensor according to claim 1, wherein surfaces of the lid and base are spaced apart to define the space therebetween, the surfaces of the lid and base are surfaces treated by a hydrophobic treatment agent, and
    a moisture content of the space is 100 ppm or less.

12. An inertial measurement unit comprising:
    a physical quantity sensor according to claim 1; and
    a micro controller that performs control based on a detection signal output from the physical quantity sensor.

* * * * *